United States Patent
Yamazaki et al.

(10) Patent No.: US 7,056,381 B1
(45) Date of Patent: *Jun. 6, 2006

(54) FABRICATION METHOD OF SEMICONDUCTOR DEVICE

(75) Inventors: Shunpei Yamazaki, Tokyo (JP); Satoshi Teramoto, Kanagawa (JP); Jun Koyama, Kanagawa (JP); Yasushi Ogata, Kanagawa (JP); Masahiko Hayakawa, Kanagawa (JP); Mitsuaki Osame, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/784,293

(22) Filed: Jan. 16, 1997

(30) Foreign Application Priority Data

Jan. 26, 1996 (JP) ................................ 8-032875

(51) Int. Cl.
*C03B 1/06* (2006.01)
(52) U.S. Cl. ........................... 117/85; 117/94; 438/151; 438/166; 438/591; 438/762; 438/777
(58) Field of Classification Search ................ 438/151, 438/166, 591, 762, 777; 117/85, 94
See application file for complete search history.

(56) References Cited

U.S. PATENT DOCUMENTS

| | | | |
|---|---|---|---|
| 3,389,024 A | 6/1968 | Schimmer | |
| 3,783,049 A | 1/1974 | Sandera | |
| RE28,385 E | 4/1975 | Mayer | |
| RE28,386 E | 4/1975 | Heiman et al. | |
| 3,890,632 A | 6/1975 | Ham et al. | |
| 4,059,461 A | 11/1977 | Fan et al. | |
| 4,068,020 A | 1/1978 | Reuschel | |
| 4,132,571 A | 1/1979 | Cuomo et al. | |
| 4,140,548 A | 2/1979 | Zimmer | |
| 4,174,217 A | 11/1979 | Flatley | |
| 4,226,898 A | 10/1980 | Ovahinsky et al. | |

(Continued)

FOREIGN PATENT DOCUMENTS

EP 178447 9/1984

(Continued)

OTHER PUBLICATIONS

R.J. Nemanich et al, "Structure and Growth of the Interface of Pd on α-SiH", The American Physical Society—Physical Review, vol. 22, No. 12, pp. 6828-6831, Jun. 1981.

(Continued)

*Primary Examiner*—Robert Kunemund
(74) *Attorney, Agent, or Firm*—Eric J. Robinson; Robinson Intellectual Property Law Office, P.C.

(57) ABSTRACT

Concentration of metal element which promotes crystallization of silicon and which exists within a crystal silicon film obtained by utilizing the metal element is reduced. A first heat treatment for crystallization is implemented after introducing nickel to an amorphous silicon film 103. Then, laser light is irradiated to diffuse the nickel element concentrated locally. After that, another heat treatment is implemented within an oxidizing atmosphere at a temperature higher than that of the previous heat treatment. A thermal oxide film 106 is formed in this step. At this time, the nickel element is gettered to the thermal oxide film 106. Then, the thermal oxide film 106 is removed. Thereby, a crystal silicon film 107 having low concentration of the metal element and a high crystallinity can be obtained.

36 Claims, 7 Drawing Sheets

U.S. PATENT DOCUMENTS

| | | |
|---|---|---|
| 4,231,809 A | 11/1980 | Schmidt |
| 4,271,422 A | 6/1981 | Ipri |
| 4,277,884 A | 7/1981 | Hsu |
| 4,300,989 A | 11/1981 | Chang |
| 4,309,224 A | 1/1982 | Shibata |
| 4,330,363 A | 5/1982 | Biegesen et al. |
| 4,331,709 A | 5/1982 | Risch et al. |
| 4,379,020 A | 4/1983 | Glaeser et al. |
| 4,409,724 A | 10/1983 | Tasch, Jr. et al. |
| 4,466,073 A | 8/1984 | Boyan et al. |
| 4,472,458 A | 9/1984 | Sirinyan et al. |
| 4,481,121 A | 11/1984 | Barthel |
| 4,511,800 A | 4/1985 | Harbeke et al. |
| 4,534,820 A | 8/1985 | Mori et al. |
| 4,544,418 A | 10/1985 | Gibbons |
| 4,546,376 A | 10/1985 | Nakata et al. |
| 4,597,160 A | 7/1986 | Ipri |
| 4,634,473 A | 1/1987 | Swartz et al. |
| 4,735,824 A | 4/1988 | Yamabe et al. |
| 4,755,481 A | 7/1988 | Faraone |
| 4,759,610 A | 7/1988 | Yanagisawa |
| 4,911,781 A | 3/1990 | Fox et al. |
| 4,959,247 A | 9/1990 | Moser et al. |
| 4,959,700 A | 9/1990 | Yamazaki |
| 4,975,760 A | 12/1990 | Dohjo et al. |
| 4,996,077 A | 2/1991 | Moslehi et al. |
| 4,996,523 A | 2/1991 | Bell et al. |
| 5,043,224 A | 8/1991 | Jaccodine et al. |
| 5,075,259 A | 12/1991 | Moran |
| 5,089,441 A | 2/1992 | Moslehi |
| 5,112,764 A | 5/1992 | Mitra et al. |
| 5,132,754 A | 7/1992 | Serikawa et al. |
| 5,145,808 A | 9/1992 | Sameshima et al. |
| 5,147,826 A | 9/1992 | Liu et al. |
| 5,173,446 A | 12/1992 | Asakawa et al. |
| 5,200,630 A | 4/1993 | Nakamura et al. |
| 5,210,050 A | 5/1993 | Yamazaki et al. |
| 5,221,423 A | 6/1993 | Sugino et al. |
| 5,225,355 A | 7/1993 | Sugino et al. |
| 5,244,836 A | 9/1993 | Lim |
| 5,254,480 A | 10/1993 | Tran |
| 5,262,350 A | 11/1993 | Yamazaki et al. |
| 5,262,654 A | 11/1993 | Yamazaki |
| 5,275,851 A | 1/1994 | Fonash |
| 5,278,093 A | 1/1994 | Yonehara |
| 5,289,030 A | 2/1994 | Yamazaki |
| 5,296,405 A | 3/1994 | Yamazaki et al. |
| 5,298,075 A | 3/1994 | Lagendijk et al. |
| 5,300,187 A | 4/1994 | Lesk et al. |
| 5,306,651 A | 4/1994 | Masumo et al. |
| 5,308,998 A | 5/1994 | Yamazaki et al. |
| 5,313,075 A | 5/1994 | Zhang et al. |
| 5,313,076 A | 5/1994 | Yamazaki et al. |
| 5,352,291 A | 10/1994 | Zhang et al. |
| 5,354,697 A | 10/1994 | Oostra et al. |
| 5,358,907 A | 10/1994 | Wong |
| 5,365,080 A | 11/1994 | Yamazaki et al. |
| 5,366,926 A | 11/1994 | Mei et al. |
| 5,372,860 A | 12/1994 | Fehlner et al. |
| 5,387,530 A | 2/1995 | Doyle et al. |
| 5,403,772 A | 4/1995 | Zhang et al. |
| 5,424,230 A | 6/1995 | Wakai |
| 5,426,064 A | 6/1995 | Zhang et al. |
| 5,470,763 A | 11/1995 | Hamada |
| 5,480,811 A | 1/1996 | Chiang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,504,019 A | 4/1996 | Miyasaka et al. |
| 5,508,207 A | 4/1996 | Horai et al. |
| 5,508,533 A | 4/1996 | Takemura |
| 5,529,937 A | 6/1996 | Zhang et al. |
| 5,530,266 A | 6/1996 | Yonehara et al. |
| 5,531,182 A | 7/1996 | Yonehara |
| 5,531,862 A | 7/1996 | Otsubo et al. |
| 5,534,716 A | 7/1996 | Takemura |
| 5,535,471 A | 7/1996 | Guldi |
| 5,543,352 A | 8/1996 | Ohtani et al. |
| 5,543,636 A | 8/1996 | Yamazaki |
| 5,550,070 A | 8/1996 | Funai et al. |
| 5,563,426 A | 10/1996 | Zhang et al. |
| 5,569,610 A | 10/1996 | Zhang et al. |
| 5,569,936 A | 10/1996 | Zhang et al. |
| 5,575,883 A | 11/1996 | Nishikawa |
| 5,580,792 A | 12/1996 | Zhang et al. |
| 5,580,815 A | 12/1996 | Hsu et al. |
| 5,585,291 A | 12/1996 | Ohtani et al. |
| 5,589,694 A | 12/1996 | Takayama et al. |
| 5,591,988 A | 1/1997 | Arai et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,610,737 A | 3/1997 | Akiyama et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A | 4/1997 | Makita et al. |
| 5,620,910 A | 4/1997 | Teramoto |
| 5,621,224 A | 4/1997 | Yamazaki et al. |
| 5,624,851 A | 4/1997 | Takayama et al. |
| 5,627,086 A | 5/1997 | Noguchi |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,661,056 A | 8/1997 | Takeuchi |
| 5,661,311 A | 8/1997 | Takemura et al. |
| 5,663,077 A | 9/1997 | Adachi et al. |
| 5,677,549 A | 10/1997 | Takayama et al. |
| 5,684,317 A | 11/1997 | Hwang |
| 5,684,365 A | 11/1997 | Tang et al. |
| 5,686,328 A | 11/1997 | Zhang et al. |
| 5,693,541 A | 12/1997 | Yamazaki et al. |
| 5,693,959 A | 12/1997 | Inoue et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,704,986 A | 1/1998 | Chen et al. |
| 5,705,829 A | 1/1998 | Miyanaga et al. |
| 5,712,191 A | 1/1998 | Nakajima et al. |
| 5,717,224 A | 2/1998 | Zhang |
| 5,728,259 A | 3/1998 | Suzawa et al. |
| 5,734,179 A | 3/1998 | Chang et al. |
| 5,744,822 A | 4/1998 | Takayama et al. ............ 257/66 |
| 5,744,824 A | 4/1998 | Kousai et al. ............... 257/74 |
| 5,756,364 A | 5/1998 | Tanaka et al. |
| 5,763,899 A | 6/1998 | Yamazaki et al. |
| 5,766,977 A | 6/1998 | Yamazaki .................. 438/151 |
| 5,773,327 A | 6/1998 | Yamazaki et al. .......... 438/154 |
| 5,773,846 A | 6/1998 | Zhang et al. ................ 257/66 |
| 5,773,847 A | 6/1998 | Hayakawa .................. 257/66 |
| 5,782,665 A | 7/1998 | Weisfield et al. |
| 5,786,796 A | 7/1998 | Takayama et al. |
| 5,795,795 A | 8/1998 | Kousai et al. ............. 437/174 |
| 5,808,321 A | 9/1998 | Mitanaga et al. ............ 257/72 |
| 5,811,327 A | 9/1998 | Funai et al. ................ 438/166 |

| | | |
|---|---|---|
| 5,818,076 A | 10/1998 | Zhang et al. |
| 5,821,138 A | 10/1998 | Yamazaki et al. .......... 438/166 |
| 5,821,560 A | 10/1998 | Arai et al. |
| 5,824,574 A | 10/1998 | Yamazaki et al. .......... 438/150 |
| 5,828,429 A | 10/1998 | Takemura |
| 5,838,508 A | 11/1998 | Sugawara |
| 5,843,225 A | 12/1998 | Takayama et al. |
| 5,846,857 A | 12/1998 | Ju |
| 5,849,611 A | 12/1998 | Yamazaki et al. |
| 5,869,363 A | 2/1999 | Yamazaki et al. |
| 5,882,960 A | 3/1999 | Zhang et al. |
| 5,888,857 A | 3/1999 | Zhang et al |
| 5,888,858 A | 3/1999 | Yamazaki et al. |
| 5,893,730 A | 4/1999 | Yamazaki et al. |
| 5,895,933 A | 4/1999 | Zhang et al. |
| 5,899,547 A | 5/1999 | Yamazaki et al. |
| 5,902,993 A | 5/1999 | Okushiba et al. |
| 5,913,111 A | 6/1999 | Kataoka et al. |
| 5,922,125 A | 7/1999 | Zhang |
| 5,929,464 A | 7/1999 | Yamazaki et al. |
| 5,929,527 A | 7/1999 | Yamazaki et al. |
| 5,932,893 A | 8/1999 | Miyanaga et al. |
| 5,933,205 A | 8/1999 | Yamazaki et al. |
| 5,940,690 A | 8/1999 | Kusumoto et al. |
| 5,940,732 A | 8/1999 | Zhang |
| 5,949,107 A | 9/1999 | Zhang |
| 5,953,597 A | 9/1999 | Kusumoto et al. |
| 5,962,869 A | 10/1999 | Yamazaki et al. |
| 5,963,278 A | 10/1999 | Yamazaki et al. |
| 5,970,327 A | 10/1999 | Makita et al. |
| 5,985,740 A | 11/1999 | Yamazaki et al. |
| 5,990,491 A | 11/1999 | Zhang |
| 5,990,542 A | 11/1999 | Yamazaki |
| 6,005,648 A | 12/1999 | Zhang et al. |
| 6,006,763 A | 12/1999 | Mori et al. |
| 6,011,275 A | 1/2000 | Ohtani et al. |
| 6,011,277 A | 1/2000 | Yamazaki |
| 6,013,929 A | 1/2000 | Ohtani |
| 6,031,249 A | 2/2000 | Yamazaki et al. |
| 6,048,758 A | 4/2000 | Yamazaki et al. |
| 6,063,654 A | 5/2000 | Ohtani |
| 6,071,764 A | 6/2000 | Zhang et al. |
| 6,077,731 A | 6/2000 | Yamazaki et al. |
| 6,077,758 A | 6/2000 | Zhang et al. |
| 6,083,801 A | 7/2000 | Ohtani |
| 6,093,934 A | 7/2000 | Yamazaki et al. |
| 6,100,562 A | 8/2000 | Yamazaki et al. |
| 6,121,683 A | 9/2000 | Yamazaki et al. |
| 6,133,073 A | 10/2000 | Yamazaki et al. |
| 6,140,165 A | 10/2000 | Zhang et al. |
| 6,147,667 A | 11/2000 | Yamazaki et al. |
| 6,162,704 A | 12/2000 | Yamazaki et al. |
| 6,175,348 B1 | 1/2001 | Zhang et al. |
| 6,177,302 B1 | 1/2001 | Yamazaki et al. |
| 6,180,439 B1 | 1/2001 | Yamazaki et al. |
| 6,194,254 B1 | 2/2001 | Takemura |
| 6,207,969 B1 | 3/2001 | Yamazaki |
| 6,225,152 B1 | 5/2001 | Yamazaki et al. |
| 6,278,132 B1 | 8/2001 | Yamazaki et al. |
| 6,288,412 B1 | 9/2001 | Hamada et al. |
| 6,294,441 B1 | 9/2001 | Yamazaki |
| 6,323,071 B1 | 11/2001 | Zhang et al. |
| 6,323,072 B1 | 11/2001 | Yamazaki et al. |
| 6,331,718 B1 | 12/2001 | Yamazaki et al. |
| 6,337,232 B1 | 1/2002 | Kusumoto et al. |
| 6,338,991 B1 | 1/2002 | Zhang et al. |
| 6,413,805 B1 | 7/2002 | Zhang et al. |
| 6,423,586 B1 | 7/2002 | Yamazaki et al. |
| 6,455,401 B1 | 9/2002 | Zhang et al. |
| 6,461,943 B1 | 10/2002 | Yamazaki et al. |
| 6,465,287 B1 | 10/2002 | Yamazaki et al. |
| 6,478,263 B1 | 11/2002 | Yamazaki et al. |
| 6,482,686 B1 | 11/2002 | Takemura |
| 6,495,404 B1 | 12/2002 | Teramoto et al. |
| 6,528,358 B1 | 3/2003 | Yamazaki et al. |
| 6,541,795 B1 | 4/2003 | Kusumoto et al. |
| 6,620,711 B1 | 9/2003 | Yamazaki |
| 2002/0025659 A1 | 2/2002 | Yamazaki et al. |
| 2002/0048891 A1 | 4/2002 | Yamazaki et al. |

FOREIGN PATENT DOCUMENTS

| | | |
|---|---|---|
| EP | 0 178 447 | 4/1986 |
| JP | 60-105216 | 6/1985 |
| JP | 61-063017 | 4/1986 |
| JP | 61-063107 | 4/1986 |
| JP | 62-169356 | 7/1987 |
| JP | 64-081324 | 3/1989 |
| JP | 1-187814 | 7/1989 |
| JP | 1-187874 | 7/1989 |
| JP | 1-187875 | 7/1989 |
| JP | 1-206632 | 8/1989 |
| JP | 2-140915 | 5/1990 |
| JP | 2-148687 | 6/1990 |
| JP | 2-275641 | 11/1990 |
| JP | 3-280418 | 12/1991 |
| JP | 3-280420 | 12/1991 |
| JP | 05-082442 | 4/1993 |
| JP | 05-107561 | 4/1993 |
| JP | 05-291220 | 11/1993 |
| JP | 05-299339 | 11/1993 |
| JP | 05-299348 | 11/1993 |
| JP | 6-232059 | 8/1994 |
| JP | 6-314785 | 11/1994 |
| JP | 6-314787 | 11/1994 |
| JP | 07-161634 | 1/1995 |
| JP | 07-066425 | 3/1995 |
| JP | 07-161634 | 6/1995 |
| JP | 07-192998 | 7/1995 |
| JP | 07-321339 | 12/1995 |
| JP | 07-335900 | 12/1995 |
| JP | 08-045839 | 2/1996 |
| JP | 08-045840 | 2/1996 |
| JP | 08-097169 | 4/1996 |
| JP | 08-129358 | 5/1996 |
| JP | 08-129359 | 5/1996 |
| JP | 08-129360 | 5/1996 |
| JP | 08-234683 | 9/1996 |
| JP | 08-241047 | 9/1996 |
| JP | 08-241048 | 9/1996 |
| JP | 08-241057 | 9/1996 |
| JP | 08-241997 | 9/1996 |
| KR | 96-005879 | 2/1996 |

OTHER PUBLICATIONS

M.J. Thompson et al, "Silicide Formation in Pd-α-Si:H Schottky Barriers", Appl. Phys. Lett., vol. 39, No. 3, pp. 274-276, Aug. 1981.

R.J. Nemanich et al, "Initial Phase Formation at the Interface of Ni, Pd, or Pt and Si", Mat. Res. Soc. Symp. Proc., vol. 25, 1984.

Caunes, et al., "Combined CW Laser and Furnace Annealing of Amorphous Si and Ge in Contact With Some Metals, " Applied Surface Science, vol. 36 Jan. 1, 1989, pp. 597-604.

J. Stoemnos et al., "Crystallization of Amorphous Silicon By Reconstructive Transformation Utilizing Gold", Appl. Phys. Lett., 58(11); Mar. 18, 1991; pp. 1196-1198.

R. Kakkad et al., "Crystallized Si Films By Low-Temperature Rapid Thermal Annealing of Amorphous Silicon", J. Appl. Phys., 65(5), Mar. 1, 1989, pp. 2069-2072.

F. Oki et al., "Effect of Deposited Metals On The Crystallization Temperature of Amorphous Germanium Film", Jpn. J. Appl. Phys., 8 (1969) 1056.

A. Y. Kuznetsov et al., "Enhanced Solid Phase Epitaxial Recrystallization of Amorphous Silicon Due to Nickel Silicide Precipitation Resulting From Ion Implantation and Annealing", Nucl. Instruments Methods Physics Research, 880/81 (1993), pp 990-993.

Hayashi et al., "Fabrication of Low-Temperature Bottom Gate Poly-Si TFTs on Large Area Substrate By Linear-Beam Excimer Laser Crystallization and Ion Doping Method," IEEE IEDM, Jan. 1, 1995, pp. 829-832.

S. Takenaka et al., "High Mobility Poly-Si Thin Film Transistors Using Solid Phase Crystallize a-Si Films Deposited By Plasma Enhanced Chemical Vapor Deposition" Jpn. J. Appl. Phys. vol. 29, No. 12, Dec. 1990; pp. L2380-L2383.

Hatalis et al., "High Performance Thin-Film Transistors in Low Temperature Crystallized LPCVD Amorphous Silicon Films", Elec. Dev. Letters vol. EDL 8, No. 8, Aug., 1987, pp. 361-364.

P. Zorabedian et al., "Lateral Seeding of Silicon-on-Insulator Using an Ellipitical Laser Beam: A Comparison of Scanning Methods", Mat. Res. Soc. Symp. Proc. vol. 33 (1984), pp 81-86.

R. Kakkad et al., "Low Temperature Selective Crystallization of Amorphous Silicon", Journal of Non-Crystalline Solids, 115 (1989), pp. 66-68.

F. Spaepen et al.,"Metal-Enhanced Growth Of Silicon ", Crucial Issues in Semiconductor Materials & Processing Technologies, (1992) 483-99.

J. M. Green et al., "Method To Purify Semiconductor Wafers" IBM Tech. Discl. Bulletin, vol. 16, No. 5, Oct. 1973, pp. 1612-1613.

T. Hempel et al., "Needle-Like Crystallization of Ni Doped Amorphous Silicon Thin Films", Solid State Communications, vol. 85, No. 11, (1993) pp. 921-924.

I.W. Boyd et al., "Oxidation of Silicon Surfaces by $CO_2$ Lasers", Applied Physics Letters, vol. 41, No. 2, Jul. 15, 1982, pp. 162-164.

G. Liu et al., "Polycrystalline Silicon Thin Film Transistors On Corning 7059 Glass Substrates Using Short Time, Low-temperature Processing," Appl. Phys. Lett. 62(20), May 17, 1993, pp. 2554-2556.

G. Liu et al., "Selective Area Crystallization of Amorphous Silicon Films By Low-Temperature Rapid Thermal Annealing", Appl. Phys. Lett 55(7), Aug. 14, 1989, pp. 660-662.

R. C. Cammarata et al., "Silicide Precipitation and Silicon Crystallization in Nickel Implanted Amorphous Silicon Thin Films", J. Mater. Res. vol. 5, No. 10, 1990; pp. 2133-2138.

C. Hayzelden et al., "Silicide Formation and Silicide Mediated Crystallization of Nickel-Implanted Amorphous Slicon Thin Films" J. Appl. Phys., 73 (12) May 15, 1993; pp. 8279-8289.

A. Y. Kuznetsov et al., "Silicide Precipitate Formation and Solid Phase Re-Growth of Ni-Implanted Amorphous Silicon" Inst. Phys. Conf. Ser. No. 134.4; Proceedings of Royal Microscopical Society Conf.; Apr. 5-8, 1993, pp. 191-194.

Wolf et al., "Silicon Processing for the VLSI Era vol. 1: Process Technology", Lattice Press 1986, pp 215-216.

S. Lau et al., "Solid Phase Epitaxy in Silicide Forming System", Thin Solid Films, 47 (1977) pp. 313-322.

Kawazu et al., "Low- Temperature Crystallization of Hydrogenated Amorphous Silicon Induced by Nickel Silicide Formation", Inst. of App. Phys., vol. 29, No. 12, Dec. 1990, pp. 2698-2704.

S. Wolf, et al., "Silicon Processing For The VLSI Era vol. 1—Process Technology", Lattice Press, 1986, pp. 550-551.

J. Bruines, et al., Applied Physics Letter, vol. 50, Mar. 1, 1987, pp. 507-509.

Y. Kawazu, et al., Japanese Journal of App. Phys., vol. 29, Apr. 1, 1990, pp. 729-738.

S. Wolf, et al., Si Processing for VLSI Era, vol. 1, Jan. 1, 1986, pp. 207-211.

J. Batstone et al., Solid State Phenomena, vol. 37-38, Jan. 1, 1994, pp. 257-268.

T. Suresh, et al., Thin Solid Films, vol. 252, Jan. 1, 1994, pp. 78-81.

K. Sakaguchi et al., IEICE Trans. Electron, vol. E80 C/No. 3, Mar. 1, 1997, pp. 378-387.

Y. Kuo, Thin Film Trans. Tech., vol. 94-35, pp. 116-122.

D. Kouvatsos, et al., Appl. Phys. Letter, vol. 61, No. 8 , Aug. 24, 1992, pp. 937-939.

S. Sze, VLSI Technology, Second Edition, Jan. 1, 1988.

Erokhin et al., Appl. Phys. Lett., Jan. 1, 1993, vol. 63, pp. 3173-3175.

Kuper et al., J. Appl. Phys., Aug. 1, 1986, vol. 60, No. 3, pp. 985-990.

Oki, F., Japan, J. Appl. Phys., Jan. 1, 1969, vol. 8, pp. 1056.

Dvurechenski et al., Phys. Stat. Sol., Jan. 1, 1986, vol. 95, pp. 635-640.

Wolf., et al., Silicon Processing For the VLSI Era, Jan. 1, 1986, vol., 1, pp. 198-207.

Gandhi, S., VLSI Fabrication Principles, Jan. 1, 1983, pp. 419-429.

A.R. Baker, Jr. et al., "Field Effect Transistor", IBM Technical Disclosure Bulletin, vol. 11, No. 7, pp. 849, 1968.

Wolf, "Silicon Processing for the VLSI Era," Process Integration, vol. 2, p. 274.

Official Filing Receipt, Specification, Abstract, Drawings, and Pending Claims of U.S. Appl. No. 09/699,466, filed Oct. 31, 2000.

J. Bruines et al., Between Explosive Crystallization and Amorphous Strength Regrowth: Inhomogeneous Solidification Upon Pulsed Laser Annealing of Amorphous Silicon, Applied Physics Letter, vol. 50, Mar. 1, 1987, pp. 507-509.

Kawazu "Initial Stage of the Interfacial Reaction Between Nickel and Hydrogenated Amorphous Silicon," Japanese Journal of Applied Physics, vol. 29, No. 4, Apr. 1990, pp. 729-738.

J. Batstone et al., "Microscopic Processes in Crystallization," Solid State Phenomena, vols. 37-38, Jan. 1 1994, pp. 257-268.

T. Suresh et al., "Electroless Plated Ni Contacts to Hyrogenated Amorphous Silicon," Thin Solid Films, vol. 252, Jan. 1, 1994, pp. 78-81.

D. Kouvatsos et al., "Fluorine-Enhanced Oxidation of Polycrystalline Silicon and Application to Thin-Film Transistor Fabrication," Applied Physics Letter, vol. 61, No. 8, Aug. 24, 1992, pp. 937-939.

K. Sakaguchi et al., "Current Progress in Epitaxial Layer Transfer (ELTRAN)," IEICE Trans. Electron, vol. E80 C/No. 3, Mar. 1, 1997, pp.378-387.

Y. Kuo, "The Electrochemical Society Proceedings," Thin Film Transistor Technologies, vol. 94-35, pp. 116-122.

S. Sze, VLSI Technology, Second Edition, Jan. 1, 1988, Chapter 3, Oxidation, pp. 397-400, McGraw Hill Publishing Company.

FABRICATION METHOD OF SEMICONDUCTOR DEVICE

FIELD OF THE INVENTION

The present invention relates to a semiconductor device typified by a thin film transistor and to a fabrication method thereof. Specifically, the present invention relates to a semiconductor device using a crystalline silicon thin film formed on a glass substrate or a quartz substrate and to a fabrication method thereof.

DESCRIPTION OF RELATED ART

Hitherto, there has been known a thin film transistor using a silicon film, i.e. a technology for forming the thin film transistor by using the silicon film formed on a glass substrate or quartz substrate.

The glass substrate or quartz substrate is used because the thin film transistor is used for an active matrix type liquid crystal display. While a thin film transistor has been formed by using an amorphous silicon film in the past, it is being tried to fabricate the thin film transistor by utilizing a silicon film having a crystallinity (referred to as "crystalline silicon film" hereinbelow) in order to enhance its performance.

The thin film transistor using the crystalline silicon film can operate at high speed by more than two digits as compared to one using an amorphous silicon film. Therefore, while peripheral driver circuits of an active matrix liquid crystal display have been composed of external IC circuits, they may be built on the glass substrate or quartz substrate similarly to the active matrix circuit.

Such structure is very advantageous in miniaturizing the whole apparatus and in simplifying the fabrication process, thus leading to the reduction of the fabrication cost.

In general, a crystal silicon film has been obtained by forming an amorphous silicon film by means of plasma CVD or reduced pressure thermal CVD and then by crystallizing it by implementing a heat treatment or by irradiating laser light.

However, it has been the fact that it is difficult to obtain a required crystallinity across the wide area through the heat treatment because it may cause nonuniformity in the crystallization.

Further, although it is possible to obtain the high crystallinity partly by irradiating laser light, it is difficult to obtain a good annealing effect across the wide area. In particular, the irradiation of the laser light is apt to become unstable under the condition for obtaining the good crystallinity.

Meanwhile, a technology described in Japanese Patent Laid-Open No. Hei. 6-232059 has been known. This is a technology which allows to obtain a crystal silicon film through a heat treatment at a lower temperature than that of the prior art by introducing a metal element (e.g. nickel) which promotes the crystallization of silicon to the amorphous silicon film.

This technology allows a high crystallinity to be obtained homogeneously across a wide area as compared to the prior art crystallization method by way of only heating or the crystallization of an amorphous silicon film by way of only irradiation of laser light.

However, it is difficult to obtain a crystal silicon film having a high crystallinity and homogeneity across a large area which is required for an active matrix type liquid crystal display.

Further, because the metal element is contained within the film and an amount thereof to be introduced has to be controlled very carefully, there is a problem in its reproducibility and stability (electrical stability of a device obtained).

Further, there is a problem that an elapsed change of the characteristics of a semiconductor device to be obtained is large or an OFF value, in case of a thin film transistor, is large, for example due to the influence of the remaining metal element.

That is, although the metal element which promotes the crystallization of silicon plays the useful role in obtaining the crystal silicon film, its existence becomes a minus factor which causes various problems after obtaining the crystal silicon film once.

BRIEF SUMMARY OF THE INVENTION

It is an object of the invention disclosed in the present specification to provide a semiconductor device having excellent characteristics by using a crystal silicon film having a high crystallinity.

It is another object of the present invention to provide a technology for reducing concentration of metal element within a crystal silicon film obtained by utilizing the metal element which promotes crystallization of silicon.

It is another object of the present invention to provide a technology which can enhance characteristics and reliability of the semiconductor device thus obtained.

One of the invention disclosed in the present specification is characterized in that it comprises steps of intentionally introducing a metal element which promotes crystallization of silicon to an amorphous silicon film and crystallizing the amorphous silicon film by a first heat treatment to obtain a crystal silicon film; irradiating laser light or intense light to the crystal silicon film; eliminating or reducing the metal element existing within the crystal silicon film by implementing a second heat treatment within an oxidizing atmosphere; eliminating a thermal oxide film formed in the previous step; and forming another thermal oxide film on the surface of the domain from which the thermal oxide film has been eliminated by implementing another thermal oxidation.

An arrangement of another invention is characterized in that it comprises steps of intentionally introducing a metal element which promotes crystallization of silicon to an amorphous silicon film and crystallizing the amorphous silicon film by a first heat treatment to obtain a crystal silicon film; irradiating laser light or intense light to the crystal silicon film to diffuse the metal element, existing within the crystal silicon film, in the crystal silicon film; implementing a second heat treatment within an oxidizing atmosphere containing to cause the metal element existing within the crystal silicon film to be gettered to a thermal oxide film to be formed; eliminating the thermal oxide film formed in the previous step; and forming another thermal oxide film on the surface of the domain from which the thermal oxide film has been eliminated by implementing another thermal oxidation.

An arrangement of another invention is characterized in that it comprises steps of intentionally introducing a metal element which promotes crystallization of silicon to an amorphous silicon film and crystallizing the amorphous silicon film by a first heat treatment to obtain a crystal silicon film; forming an active layer of a semiconductor device by patterning the crystal silicon film; irradiating laser light or intense light to the active layer; implementing a second heat treatment within an oxidizing atmosphere to eliminate or reduce the metal element existing within the active layer; eliminating a thermal oxide film formed in the previous step; and forming another thermal oxide film on the surface of the active layer by implementing another thermal oxidation.

An arrangement of another invention is characterized in that it comprises steps of intentionally and selectively introducing a metal element which promotes crystallization of silicon to an amorphous silicon film; implementing a first heat treatment to the amorphous silicon film to grow crystal in a direction parallel to the film from a domain of the amorphous silicon film into which the metal element has been intentionally and selectively introduced; irradiating laser light or intense light to diffuse the metal element existing within the domain where the crystal has grown; implementing a second heat treatment within an oxidizing atmosphere to cause the metal element existing within the domain where the crystal has grown to be gettered to a thermal oxide film to be formed; eliminating the thermal oxide film formed in the previous step; and forming another thermal oxide film on the surface of the domain from which the thermal oxide film has been eliminated by implementing another thermal oxidation.

An arrangement of another invention is characterized in that it comprises steps of intentionally introducing a metal element which promotes crystallization of silicon to an amorphous silicon film and crystallizing the amorphous silicon film by a first heat treatment to obtain a crystal silicon film; forming an active layer of a semiconductor device by patterning the crystal silicon film; irradiating laser light or intense light to the active layer; implementing a second heat treatment within an oxidizing atmosphere to eliminate or reduce the metal element existing within the active layer; eliminating a thermal oxide film formed in the previous step; and forming another thermal oxide film on the surface of the active layer by implementing another thermal oxidation, wherein the active layer has an inclined shape in which an angle formed between a side face and an underlying face is 20° to 50°.

In the invention disclosed in the present specification, one or a plurality elements selected from Fe, Co, Ni, Ru, Rh, Pd, Os, Ir, Pt, Cu and Au may be used as the metal element which promotes the crystallization of silicon.

The concentration of impurity in the present specification is defined as the minimum value of measured values measured by the SIMS (secondary ion mass spectrometry).

According to a preferred mode for carrying out the invention disclosed in the present specification, an amorphous silicon film is formed at first. Then, the amorphous silicon film is crystallized by an action of metal element typified by nickel which promotes crystallization of silicon to obtain a crystal silicon film. The crystallization is carried out by heat treatment.

This heat treatment is implemented within a range of 600° C. to 750° C. It is important to implement the heat treatment in temperature above 600° C.

The metal element is contained in the crystal silicon film in the state in which the film has been crystallized by the above-mentioned heat treatment.

Here, laser light is irradiated to promote the crystallization of the crystal silicon film obtained and to diffuse (disperse) the nickel element existing within the film further within the film in the same time.

In the state in which the film is crystallized by the first heat treatment, the nickel element exists as certain blocks. Then, the nickel element may be diffused by a certain degree so that it may be readily gettered later by irradiating the laser light described above.

After irradiating the laser light, another heat treatment is implemented within an oxidizing atmosphere to form a thermal oxide film on the surface of the crystal silicon film.

An atmosphere of 100% of oxygen or that of oxygen diluted by inert gas is used as the oxidizing atmosphere.

At this time, the metal element is gettered to the thermal oxide film and the concentration of the metal element within the crystal silicon film drops.

The heat treatment for gettering the nickel element is preferable to implement at a temperature higher than that of the heat treatment for the crystallization.

As a result of the heat treatment for gettering, a thermal oxide film containing the nickel element in high concentration is formed. Then, the crystal silicon film having the high crystallinity and having low concentration of the metal element may be obtained by eliminating this thermal oxide film.

BRIEF DESCRIPTION OF DRAWINGS

FIG. 7a–f is a diagram showing states when laser light is irradiated to patterns made of the crystal silicon film.

DETAILED DESCRIPTION OF THE INVENTION

First Embodiment

Figure 1A:
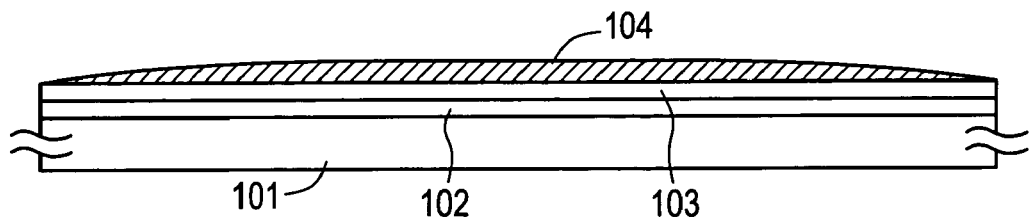
FIG. 1a–e is a diagram showing steps for obtaining a crystal silicon film.

An arrangement for obtaining a crystal silicon film on a glass substrate by utilizing nickel element will be explained in the present embodiment.

At first, the crystal silicon film having a high crystallinity is obtained by an action of nickel element in the present embodiment.

Then, laser light is irradiated to enhance the crystallinity of the film and to diffuse nickel element existing locally concentratedly within the film. That is, the block of nickel is extinguished.

Next, a thermal oxide film is formed on the crystal silicon film by thermal oxidation. At this time, the nickel element remaining in the crystal silicon film thus obtained is gettered to the thermal oxide film. Because the nickel element is distributed by the irradiation of the laser light, the gettering proceeds effectively.

Then, the thermal oxide film containing the nickel element in high concentration as a result of the gettering is eliminated. Thereby, the crystal silicon film having nickel element in low concentration while having the high crystallinity is obtained on the glass substrate.

A fabrication process of the present embodiment will be explained by using FIG. 1 below. At first, a silicon oxide nitride film 102 is formed as an underlying film in a thickness of 3000 angstrom on the glass substrate 101 of Corning 1737 (distortion point: 667° C.).

The silicon oxide nitride film is formed by using plasma CVD using silane, $N_2O$ gas and oxygen as original gases. Or, it may be formed by using plasma CVD using TEOS gas and $N_2O$ gas.

The silicon oxide nitride film has a function of suppressing the diffusion of impurities from the glass substrate in the later steps (seeing from the level of fabrication of a semiconductor, a glass substrate contains a large amount of impurities).

It is noted that although the silicon nitride film is most suitable to maximize the function of suppressing the diffusion of the impurities, the silicon nitride film is not practical because it is peeled off from the glass substrate due to the influence of stress. A silicon oxide film may be also used as the underlying film instead of the silicon oxide nitride film.

It is also important to increase the hardness of the underlying film 102 as much as possible. It is concluded from the fact that the harder the hardness of the underlying film (i.e. the smaller the etching rate thereof), the higher the reliability is in an endurance test of the thin film transistor obtained in the end. It is assumed to be caused by the effect of blocking the impurities from the glass substrate in the fabrication process of the thin film transistor.

It is also effective to include a small amount of halogen element typified by chlorine in the underlying film 102. Thereby, the metal element which promotes crystallization of silicon and which exists within the semiconductor layer may be gettered by the halogen element in the later step.

It is also effective to add a hydrogen plasma treatment after forming the underlying film. It is also effective to implement a plasma treatment in an atmosphere in which oxygen and hydrogen are mixed. These treatments are effective in eliminating carbon component which is adsorbed on the surface of the underlying film and in enhancing the interfacial characteristic with a semiconductor film formed later.

Next, an amorphous silicon film 103, which turns out to be a crystal silicon film later, is formed in a thickness of 500 angstrom by the reduced pressure thermal CVD. The reason why the reduced pressure thermal CVD is used is because thereby, the quality of the crystal silicon film obtained later is better, i.e. the film quality is denser in concrete. Beside the reduced pressure thermal CVD, the plasma CVD may be used.

The amorphous silicon film fabricated here is desirable to have $5\times10^{17}$ $cm^{-3}$ to $2\times10^{19}$ $cm^{-3}$ of concentration of oxygen within the film. It is because oxygen plays an important role in the later step of gettering the metal element which promotes crystallization of silicon.

However, it must be careful here because the crystallization of the amorphous silicon film is hampered if the oxygen concentration is higher than the above-mentioned range of concentration.

The concentration of other impurities such as those of nitrogen and carbon is preferred to be low to the utmost. In concrete, the concentration must be below $2\times10^{19}$ $cm^{-3}$.

The upper limit of the thickness of the amorphous silicon film is about 2000 angstrom. It is because it is disadvantageous to have a thick film to obtain the effect of laser irradiated later. Thick film is disadvantageous because the laser light irradiated to the silicon film is absorbed almost by the surface of the film.

The lower limit of the amorphous silicon film 103 is practically about 200 angstrom, though it depends on how to form it.

Next, nickel element is introduced to the amorphous silicon film 103 to crystallize it. Here, the nickel element is introduced by applying nickel acetate solution containing 10 ppm (reduced to weight) of nickel on the surface of the amorphous silicon film 103.

Beside the method of using the above-mentioned solution, sputtering, CVD, plasma treatment or adsorption may be used as the method for introducing the nickel element.

The method of using the solution is useful in that it is simple and that the concentration of the metal element may be readily adjusted.

The nickel acetate solution is applied as described above to form a water film (liquid film) 104 as shown in FIG. 1A. In this state, extra solution is blown out by using a spin coater not shown. Thus, the nickel element is held in contact on the surface of the amorphous silicon film 103.

It is noted that it is preferable to use nickel sulfate solution for example, instead of using the nickel acetate, if the remained impurities in the later heating process is taken into consideration. It is because the nickel acetate contains carbon and it might be carbonized in the later heating process, thus remaining within the film.

An amount of the nickel element to be introduced may be controlled by adjusting the concentration of nickel element within the solution.

Figure 1B:
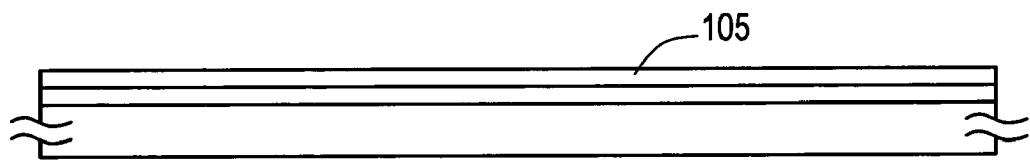

Next, a heat treatment is implemented in the temperature range from 550° C. to 650° C. in the state shown in FIG. 1B to crystallize the amorphous silicon film 103 and to obtain a crystal silicon film 105. This heat treatment is implemented in a reducing atmosphere.

It is preferable to implement the heat treatment below the temperature of the distortion point of the glass substrate. Because the distortion point of the Corning 1737 glass substrate is 667° C., the upper limit of the heating temperature here is preferable to be about 650° C., leaving some margin.

Here, the heat treatment is implemented for four hours at 620° C. within a nitrogen atmosphere containing 3% of hydrogen.

The reason why the reducing atmosphere is adopted in the crystallization step in a way of the heat treatment is to prevent oxides from being created in the step of the heat treatment and more concretely, to suppress nickel from reacting with oxygen and NiOx from being created on the surface of the film or within the film.

Oxygen couples with nickel and contributes a lot in gettering nickel in the later gettering step. However, it has been found that if oxygen couples with nickel in the above-mentioned stage of the crystallization, it hampers the crystallization. Accordingly, it is important to suppress the oxides from being created to the utmost in the crystallization step carried out by way of heating.

The concentration of oxygen within the atmosphere for implementing the heat treatment for the crystallization has to be in an order of ppm, or preferably, less than 1 ppm.

Inert gases such as argon, beside nitrogen, may be used as the gas which occupies the most of the atmosphere for implementing the heat treatment for the crystallization.

After the crystallization step by way of the heat treatment, nickel element remains as certain blocks. This fact has been confirmed from the observation by means of TEM (transmission electron microscope).

Although the cause of the fact that the nickel exists as certain blocks is not clear yet, it is considered to be related with some crystallization mechanism.

Figure 1C:
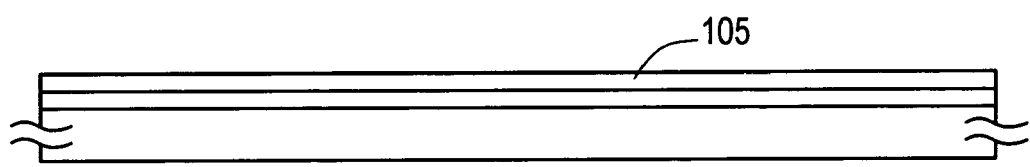

Next, laser light is irradiated as shown in FIG. 1C. Here, KrF excimer laser (wavelength: 248 nm) is used. Here, a method of irradiating the laser light by scanning its linear beam is adopted.

The nickel element which has been locally concentrated as a result of the crystallization carried out by way of the aforementioned heat treatment is distributed by a certain degree within the film 105 by irradiating the laser light. That is, the nickel element may be distributed by distinguishing the blocks of the nickel element.

Figure 1D:
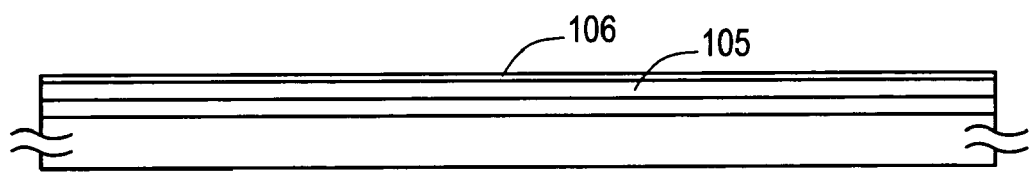

Another heat treatment is implemented in the step shown in FIG. 1D to form a thermal oxide film for gettering the nickel element. Here, this heat treatment is implemented within an atmosphere of 100% of oxygen for 12 hours. As a result of this step, the thermal oxide film is formed in a thickness of 100 angstrom (FIG. 1D).

This step is carried out to eliminate the nickel element which has been introduced intentionally for the crystallization in the initial stage from the crystal silicon film 105. This heat treatment is implemented at a temperature higher than that of the heat treatment implemented for the crystallization described above. It is an important condition for effectively implementing the gettering of nickel element.

This heat treatment is implemented in the temperature range from 600° C. to 750° C. upon meeting the above-mentioned condition. The effect of gettering the nickel element in this step may be obtained remarkably when the temperature is higher than 600° C.

In this step, the nickel element which has been distributed by the above-mentioned irradiation of laser is effectively gettered to the oxide film.

Further, the upper limit of the heating temperature is limited by the distortion point of the glass substrate to be used. It must be careful not to implement the heat treatment in a temperature above the distortion point of the glass substrate to be used because, otherwise, it is deformed.

Because the thermal oxide film 106 is formed, the thickness of the crystal silicon film 103 becomes about 450 angstrom.

When the heating temperature is 600° C. to 750° C. in this heat treatment, the treatment time (heating time) is set at 10 hours to 48 hours or typically at 24 hours.

This treatment time is set adequately depending on the thickness of the oxide film to be obtained as a matter of course.

In the gettering, oxygen existing within the crystal silicon film plays an important role. That is, the gettering of the nickel element proceeds in a form of nickel oxide formed when oxygen couples with nickel.

If the concentration of oxygen is too much, it becomes the factor of hampering the crystallization of the amorphous silicon film 103 in the crystallization step shown in FIG. 1B as described above. However, the existence thereof plays an important role in the process of gettering nickel as described above. Accordingly, it is important to control the concentration of oxygen existing within the amorphous silicon film, the starting film.

Because the nickel element is gettered to the oxide film thus formed in the above-mentioned step, naturally the nickel concentration within the oxide film becomes high as compared to other domains.

Further, it has been observed that the concentration of nickel element is apt to be high near the interface of the crystal silicon film 105 with the oxide film 106. It is considered to happen because the domain where the gettering mainly takes place is on the side of the oxide film near the interface between the silicon film and the oxide film. The gettering proceeding near the interface is considered to be caused by the existence of stress and defects, or organic substances near the interface.

Then, the thermal oxide film 106 containing nickel in high concentration is eliminated. The thermal oxide film 106 may be eliminated by means of wet etching or dry etching using buffer hydrofluoric acid (or other hydrofluorite etchant).

Figure 1E:
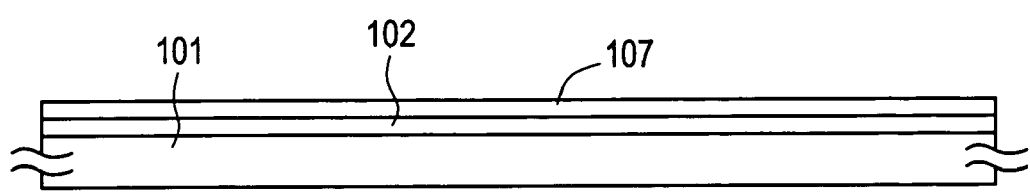

Thus, a crystal silicon film 107 in which the concentration of nickel has been reduced is obtained as shown in FIG. 1E.

Because nickel element is contained near the surface of the obtained crystal silicon film 107 relatively in high concentration, it is effective to advance the above-mentioned etching to over-etch, more or less, the surface of the crystal silicon film 107.

It is also effective to irradiate laser light again after removing the thermal oxide film 106 to promote the crystallinity of the crystal silicon film 107 thus obtained further. That is, it is effective to irradiate laser light again after gettering the nickel element.

Although the case when the KrF excimer laser (wavelength: 248 nm) is used as the laser to be used has been shown in the present specification, it is possible to use a XeCl excimer laser (wavelength: 308 nm) and other types of excimer lasers.

It is also possible to arrange so as to irradiate ultraviolet rays or infrared rays for example instead of laser light.

Second Embodiment

The present embodiment relates to a case when Cu is used as the metal element which promotes the crystallization of silicon in the arrangement shown in the first embodiment. In this case, cupric acetate [$Cu(CH_3 COO)_2$] or cupricchloride ($CuCl_2 2H_2O$) may be used as the solution for introducing Cu.

Third Embodiment

The present embodiment relates to a case of growing crystal in the form different from that in the first embodiment. That is, the present embodiment relates to a method of growing the crystal in a direction parallel to the substrate, i.e. a method called lateral growth, by utilizing the metal element which promotes crystallization of silicon.

FIG. 2 shows the fabrication process according to the present embodiment. At first, a silicon oxide nitride film is formed as an underlying film 202 in a thickness of 3000 angstrom on the Corning 1737 glass substrate (or a quartz substrate) 201.

Next, an amorphous silicon film 203 which is the starting film of a crystal silicon film is formed in a thickness of 600 angstrom by reduced pressure thermal CVD. The thickness of the amorphous silicon film is preferable to be less than 2000 angstrom as described before.

It is noted that plasma CVD may be used instead of the reduced pressure thermal CVD.

Next, a silicon oxide film not shown is formed in a thickness of 1500 angstrom and is patterned to form a mask 204. An opening is created on the mask in a domain 205. The amorphous silicon film 203 is exposed at the domain where the opening 205 is created.

The opening 205 has a thin and long rectangular shape in the longitudinal direction from the depth to the front side of the figure. Preferably, the width of the opening 203 is 20 μm or more. The length thereof in the longitudinal direction may be determined arbitrarily.

Then, the nickel acetate aqueous solution containing 10 ppm of nickel element in terms of weight is applied in the same manner with the first embodiment and the extra solution is removed by implementing spin drying by using a spinner not shown.

Figure 2A:
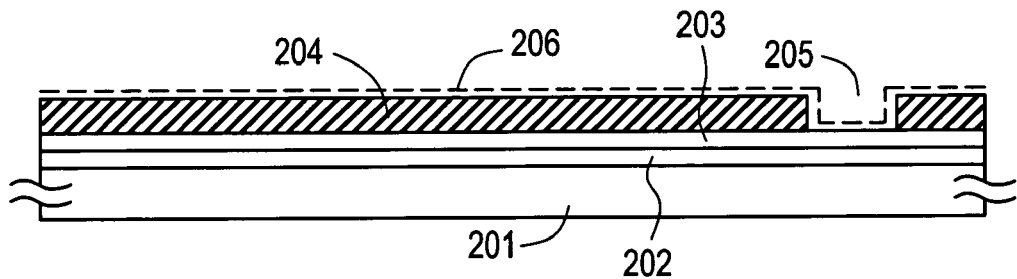
FIG. 2a–e is a diagram showing steps for obtaining a crystal silicon film.

Thus, the solution is held in contact on the exposed surface of the amorphous silicon film 203 as indicated by a dot line 206 in FIG. 2A.

Next, a heat treatment is implemented at 640° C. for four hours in a nitrogen atmosphere containing 3% of hydrogen and in which oxygen is minimized.

Figure 2B:
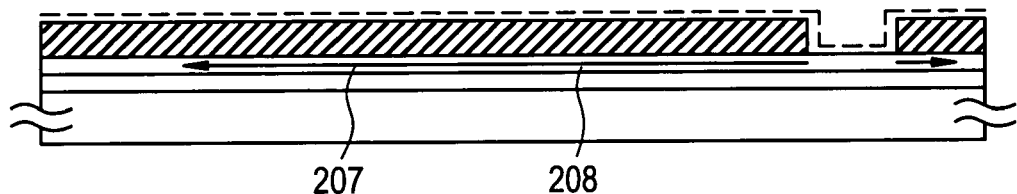

Then, crystal grows in the direction parallel to the substrate as indicated by the reference numeral 207 in FIG. 2B. This crystal growth advances from the domain of the opening 205 to which nickel element has been introduced to the surrounding part. This crystal growth in the direction parallel to the substrate will be referred to as lateral growth.

It is possible to advance this lateral growth across more than 100 m under the conditions shown in the present embodiment. Then, a silicon film 208 having the domain in which the crystal has thus grown laterally is obtained. It is noted that crystal growth in the vertical direction called vertical growth advances from the surface of the silicon film to the underlying interface in the domain where the opening 205 is formed.

Figure 2C:

Then, the mask 204 made of the silicon oxide film for selectively introducing nickel element is eliminated. Thus, the state shown in FIG. 2C is obtained. In this state, the vertically grown domain, the laterally grown domain and a domain in which no crystal has grown (having amorphous state) exist within the silicon film 208.

In this state, the nickel element is unevenly distributed in the film. In particular, the nickel element exists relatively in high concentration at the domain where the aperture 205 has been formed and at the edge portion 207 of the crystal growth.

After obtaining the state shown in FIG. 2C, laser light is irradiated. The KrF excimer laser is irradiated here similarly to the first embodiment.

The nickel element which has been unevenly distributed is diffused in this step to obtain a condition in which it can be gettered readily in the later gettering step.

Figure 2D:
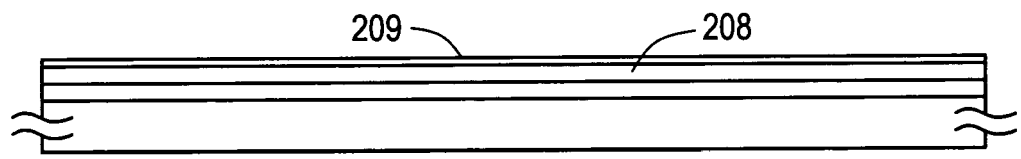

After irradiating the laser light, a heat treatment is implemented at 650° C. for 12 hours within an atmosphere of 100% of oxygen. In this step, an oxide film 209 containing nickel element in high concentration is formed. In the same time, the concentration of nickel element within the silicon film 208 may be reduced relatively (FIG. 2D).

Here, the thermal oxide film 209 is formed in a thickness of 100 angstrom. The thermal oxide film contains the nickel element thus gettered in high concentration. Further, because the thermal oxide film 209 is formed, the thickness of the crystal silicon film 208 is reduced to about 500 angstrom.

Next, the thermal oxide film 209 containing nickel element in high concentration is eliminated.

In the crystal silicon film of this state, the nickel element has a distribution of concentration such that it exists in high concentration toward the surface of the crystal silicon film. This state is caused by the fact that the nickel element has been gettered to the thermal oxide film 209 when the thermal oxide film was formed.

Accordingly, it is useful to etch the surface of the crystal silicon film to eliminate the domain in which the nickel element exists in high concentration after eliminating the thermal oxide film 209. That is, the crystal silicon film in which the nickel element concentration is reduced further may be obtained by etching the surface of the crystal silicon film in which the nickel element exists in high concentration. However, it is necessary to consider the thickness of the silicon film finally obtained at this time.

Next, patterning is implemented to form a pattern 210 formed of the laterally grown domain.

The concentration of nickel element which remains within the pattern 210 made of the laterally grown domain thus obtained may be reduced further as compared to the case shown in the first embodiment.

This is caused by the fact that the concentration of the metal element contained within the laterally grown domain is low originally. In concrete, the concentration of nickel element within the pattern 209 made of the laterally grown domain may be readily reduced to the order of $10^{17}$ cm$^{-3}$ or less.

When a thin film transistor is formed by utilizing the laterally grown domain, a semiconductor device having a higher mobility may be obtained as compared to the case when the vertically grown domain as shown in the first embodiment (crystal grows vertically on the whole surface in the case of the first embodiment) is utilized.

Figure 2E:
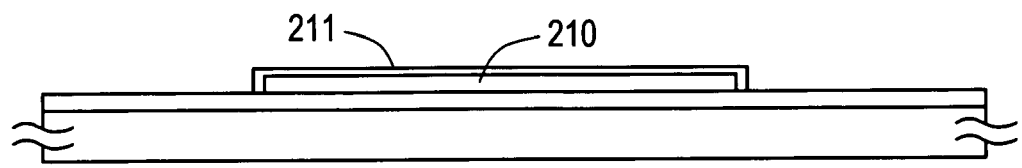

It is noted that it is useful to implement the etching process further after forming the pattern shown in FIG. 2E to eliminate the nickel element existing on the surface of the pattern.

Then, a thermal oxide film 211 is formed after thus forming the pattern 210. This thermal oxide film is formed into a thickness of 100 angstrom by implementing a heat treatment for 12 hours in an oxygen atmosphere at 650° C.

This thermal oxide film becomes a part of a gate insulating film later when a thin film transistor is constructed.

If the thin film transistor is to be fabricated thereafter, a silicon oxide film is formed further by means of plasma CVD or the like so as to cover the thermal oxide film 211 to form a gate insulating film together with the thermal oxide film 211.

Fourth Embodiment

The present embodiment relates to a case of fabricating a thin film transistor disposed in a pixel domain of an active matrix type liquid crystal display or an active matrix type EL display by utilizing the invention disclosed in the present specification.

FIG. 3 shows the fabrication process according to the present embodiment. At first, the crystal silicon film is formed on the glass substrate through the process shown in the first or the third embodiment. When the crystal silicon film is obtained by the arrangement shown in the first embodiment, it is patterned to obtain the state shown in FIG. 3A.

Figure 3A:
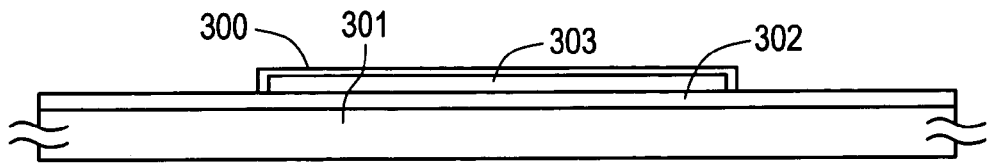
FIG. 3a–e is a diagram showing steps for fabricating a thin film transistor.

In the state shown in FIG. 3A, the reference numeral 301 denotes a glass substrate, 302 an underlying film, and 303 an active layer formed of the crystal silicon film. After obtaining the state shown in FIG. 3A, a plasma treatment is implemented within a reduced pressure atmosphere in which oxygen and hydrogen are mixed. The plasma is generated by high-frequency discharge.

Organic substances existing on the surface of the exposed active layer 303 may be removed by the above-mentioned plasma treatment. Specifically, the organic substances adsorbing on the surface of the active layer are oxidized by oxygen plasma and the oxidized organic substances are reduced and vaporized further by hydrogen plasma. Thus the organic substances existing on the surface of the exposed active layer 303 are removed.

The removal of the organic substances is very effective in suppressing fixed charge from existing on the surface of the active layer 303. Because the fixed charge caused by the existence of organic substances hampers the operation of the device and renders the characteristics thereof instable, it is very useful to reduce it.

After removing the organic substances, thermal oxidation is implemented within an oxygen atmosphere at 640° C. to form a thermal oxide film 300 of 100 angstrom thick. This thermal oxide film has a high interfacial characteristic with a semiconductor layer and composes a part of a gate insulating film later. Thus, the state shown in FIG. 3A is obtained.

After obtaining the state shown in FIG. 3A, a silicon oxide nitride film 304 which composes the gate insulating film is formed in a thickness of 1000 angstrom. The film may be formed by using plasma CVD using mixed gas of silane and $N_2O$ or plasma CVD using mixed gas of TEOS and $N_2O$.

The silicon oxide nitride film 304 functions as the gate insulating film together with the thermal oxide film 300.

It is also effective to contain halogen element within the silicon oxide nitride film. That is, it is possible to prevent the function of the gate insulating film as an insulating film from dropping by the influence of the nickel element (or another metal element which promotes crystallization of silicon) existing within the active layer by fixing the nickel element by the action of the halogen element.

It is significant to use the silicon oxide nitride film in that metal element hardly infiltrates to the gate insulating film from its dense film quality. If metal element infiltrates into the gate insulating film, its function as an insulating film drops, thus causing instability and dispersion of characteristics of the thin film transistor.

It is noted that a silicon oxide film which is normally used may be also used for the gate insulating film.

After forming the silicon oxide nitride film 304 which functions as the gate insulating film, an aluminum film not shown which functions as a gate electrode later is formed by sputtering. 0.2 weight % of scandium is included within the aluminum film.

Scandium is included in the aluminum film to suppress hillock and whisker from being produced in the later process. The hillock and whisker mean that abnormal growth of aluminum occurs by heating, thus forming needle or prickle-like projections.

After forming the aluminum film, a dense anodic oxide film not shown is formed. The anodic oxide film is formed by using ethylene glycol solution containing 3% of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later.

It is noted that the thickness of the anodic oxide film may be controlled by adjusting voltage applied during the anodization.

Figure 3B:
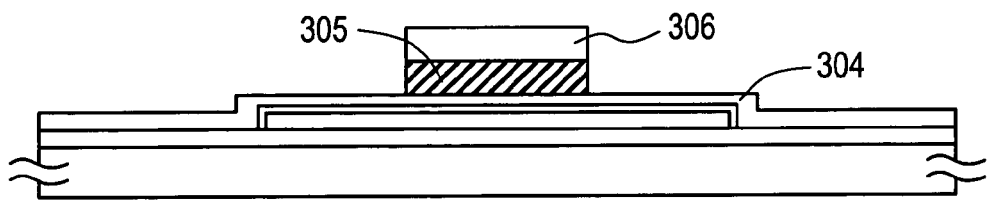
Figure 3C:
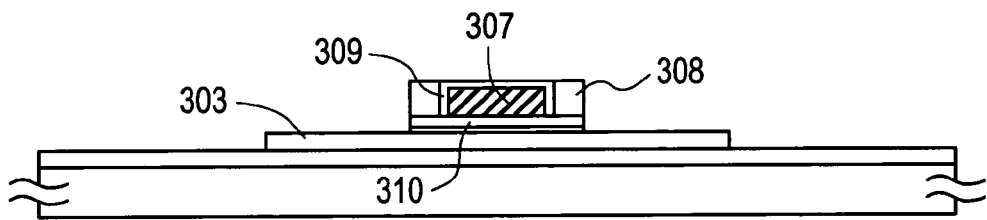

Next, the resist mask 306 is formed and the aluminum film is patterned so as to have a pattern 305. The state shown in FIG. 3B is thus obtained.

Here, another anodization is implemented. In this case, 3% of oxalate aqueous solution is used as electrolyte. A porous anodic oxide film 308 is formed by anodizing within this electrolyte by setting the aluminum pattern 305 as the anode.

In this step, the anodic oxide film 308 is formed selectively on the sides of the aluminum pattern because the resist mask 306 having the high adhesiveness exists thereabove.

The anodic oxide film may be grown up to several μm thick. The thickness is 6000 angstrom here. It is noted that the range of the growth may be controlled by adjusting an anodizing time.

Next, the resist mask 306 is removed. Then, a dense anodic oxide film is formed again. That is, the anodization is implemented again by using the ethylene glycol solution containing 3% of tartaric acid as electrolyte. Then, an anodic oxide film 309 having a dense film quality is formed because the electrolyte infiltrates into the porous anodic oxide film 308.

This dense anodic oxide film 309 is 1000 angstrom thick. The thickness is controlled by adjusting applied voltage.

Here, the exposed silicon oxide nitride film 304 and the thermal oxide film 300 are etched by utilizing dry etching. Then, the porous anodic oxide film 308 is eliminated by using mixed acid in which acetic acid, nitric acid and phosphoric acid are mixed. Thus, the state shown in FIG. 3D is obtained.

Figure 3D:
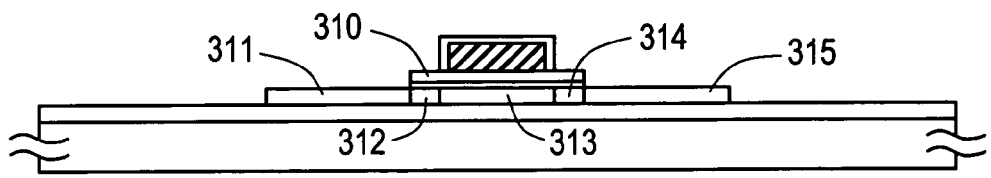

After obtaining the state shown in FIG. 3D, impurity ions are injected. Here, P (phosphorus) ions are injected by plasma doping in order to fabricate an N-channel type thin film transistor.

In this step, heavily doped domains 311 and 315 and lightly doped domains 312 and 314 are formed because part of the remaining silicon oxide film 310 functions as a semi-permeable mask, thus blocking part of the injected ions.

Then, laser light or intense light is irradiated to activate the domains into which the impurity ions have been injected. Thus, a source domain 311, a channel forming domain 313, a drain domain 315 and low concentrate impurity domains 312 and 314 are formed in a manner of self-adjustment.

One designated by the reference numeral 314 here is the domain called the LDD (lightly doped domain) (FIG. 3D).

It is noted that when the dense anodic oxide film 309 is formed as thick as 2000 angstrom or more, an offset gate domain may be formed on the outside of the channel forming domain 313 by its thickness.

Although the offset gate domain is formed also in the present embodiment, it is not shown in the figures because its size is small, its contribution due to the existence thereof is small and the figures might otherwise become complicated.

Next, a silicon oxide film or a silicon nitride film or their laminated film is formed as an interlayer insulating film 316. The interlayer insulating film may be constructed by forming a layer made of a resin material on the silicon oxide film or the silicon nitride film.

Figure 3E:
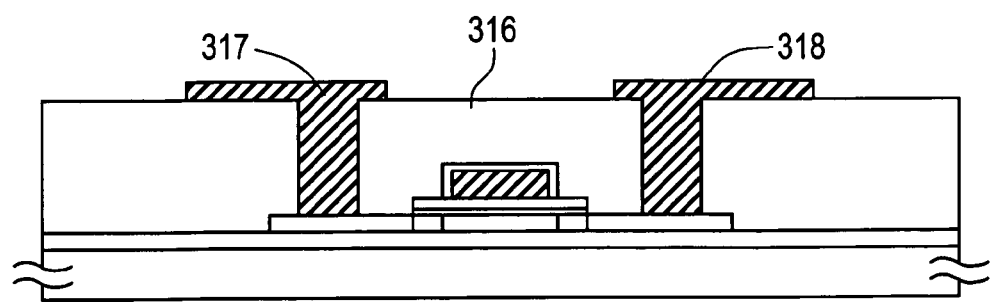

Then, contact holes are created to form a source electrode 317 and a drain electrode 318. Thus, the thin film transistor shown in FIG. 3E is completed.

Fifth Embodiment

The present embodiment relates to a method for forming the gate insulating film 304 in the arrangement shown in the seventh embodiment. Thermal oxidation may be used as a method for forming the gate insulating film when a quartz substrate or a glass substrate having a high heat resistance is used as the substrate.

The thermal oxidation allows the film quality to be densified and is useful in obtaining a thin film transistor having stable characteristics.

That is, because an oxide film formed by the thermal oxidation is dense as an insulating film and movable electric charge existing therein can be reduced, it is one of the most suitable films as a gate insulating film.

Sixth Embodiment

The present embodiment relates to a case of fabricating a thin film transistor through a process different from that shown in FIG. 3.

FIG. 4 shows the fabrication process according to the present embodiment. At first, the crystal silicon film is formed on the glass substrate through the process shown in the first or third embodiment. It is then patterned, thus obtaining the state shown in FIG. 4A.

Figure 4A:
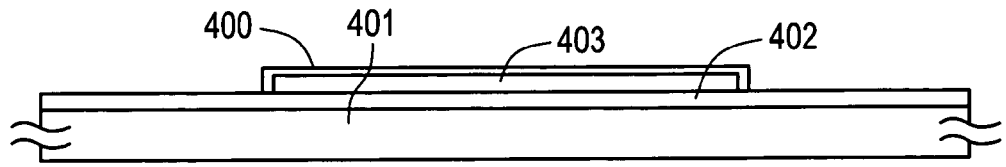
FIG. 4a–e is a diagram showing steps for fabricating a thin film transistor.
Figure 4B:
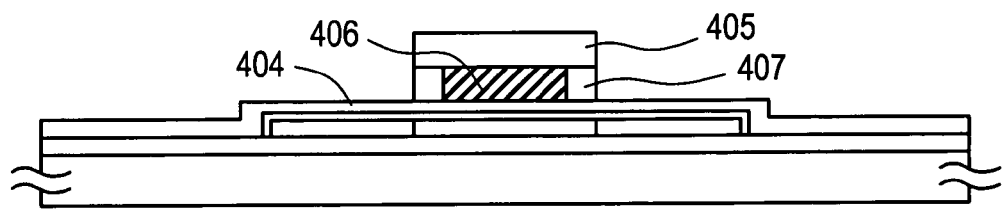
Figure 4C:
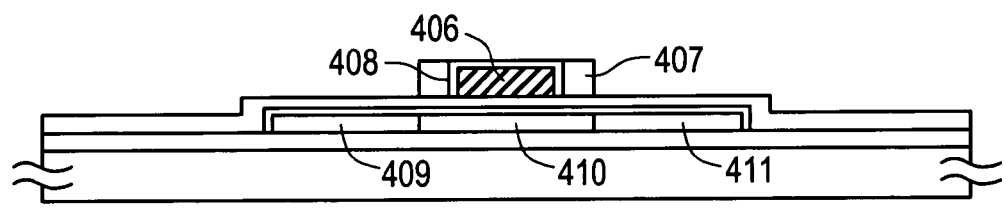

After obtaining the state shown in FIG. 4A, a plasma treatment is implemented within a reduced pressure atmosphere in which oxygen and hydrogen are mixed.

In the state shown in FIG. 4A, the reference numeral 401 denotes a glass substrate, 402 an underlying film, 403 an active layer made of the crystal silicon film and 400 a thermal oxide film formed again after eliminating the thermal oxide film for gettering.

After obtaining the state shown in FIG. 4A, a silicon oxide nitride film 404 which composes a gate insulating film is formed in a thickness of 1000 angstrom. The film may be formed by using plasma CVD using mixed gas of oxygen, sillane and $N_2O$ or plasma CVD using mixed gas of TEOS and $N_2O$.

The silicon oxide nitride film 404 composes the gate insulating film together with the thermal oxide film 400. It is noted that a silicon oxide film may be used beside the silicon oxide nitride film.

After forming the silicon oxide nitride film 404 which functions as the gate insulating film, an aluminum film not shown which functions as a gate electrode later is formed by sputtering. 0.2 weight % of scandium is included within the aluminum film.

After forming the aluminum film, a dense anodic oxide film not shown is formed. The anodic oxide film is formed by using ethylene glycol solution containing 3% of tartaric acid as electrolyte. That is, the anodic oxide film having the dense film quality is formed on the surface of the aluminum film by setting the aluminum film as the anode and platinum as the cathode and by anodizing within this electrolyte.

The thickness of the anodic oxide film not shown having the dense film quality is around 100 angstrom. This anodic oxide film plays a role of enhancing the adhesiveness with a resist mask to be formed later.

It is noted that the thickness of the anodic oxide film may be controlled by adjusting voltage applied during the anodization.

Next, the resist mask 405 is formed and the aluminum film is patterned so as to have a pattern 406.

Here, another anodization is implemented. In this case, 3% of oxalate aqueous solution is used as electrolyte. A porous anodic oxide film 407 is formed by anodizing within this electrolyte by setting the aluminum pattern 406 as the anode.

In this step, the anodic oxide film 407 is formed selectively on the sides of the aluminum pattern because the resist mask 405 having the high adhesiveness exists thereabove.

The anodic oxide film may be grown up to several µm thick. The thickness is 6000 angstrom here. It is noted that the range of the growth may be controlled by adjusting an anodizing time.

Then, the resist mask 405 is removed and another dense anodic oxide film is formed. That is, the anodization is implemented again by using the ethylene glycol solution containing 3% of tartaric acid as electrolyte. Then, an anodic oxide film 408 having a dense film quality is formed because the electrolyte infiltrates into the porous anodic oxide film 407 (FIG. 2C).

Here, the initial injection of impurity ions is implemented. This step may be implemented after removing the resist mask 405.

A source domain 409 and a drain domain 411 are formed by injecting the impurity ions. No impurity ion is injected to a domain 410.

Then, the porous anodic oxide film 307 is eliminated by using mixed acid in which acetic acid, nitric acid and phosphoric acid are mixed. Thus, the state shown in FIG. 4D is obtained.

Figure 4D:
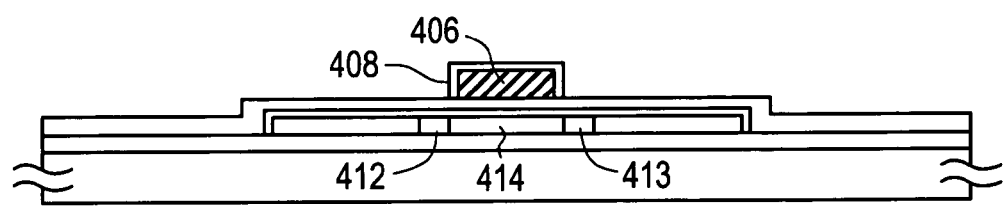

After obtaining the state shown in FIG. 4D, impurity ions are injected again. The impurity ions are injected under the doping condition lighter than that of the first injection.

In this step, lightly doped domains 412 and 413 are formed and a domain 414 turns out to be a channel forming domain (FIG. 4D).

Then, laser light or intense light is irradiated to activate the domains into which the impurity ions have been injected. Thus, the source domain 409, the channel forming domain 414, the drain domain 411 and low concentrate impurity domains 412 and 413 are formed in a manner of self-adjustment.

Here, one designated by the reference numeral 413 is the domain called the LDD (lightly doped domain) (FIG. 4D).

Next, a silicon oxide film or a silicon nitride film or their laminated film is formed as an interlayer insulating film 414. The interlayer insulating film may be constructed by forming a layer made from a resin material on the silicon oxide film or the silicon nitride film.

Figure 4E:
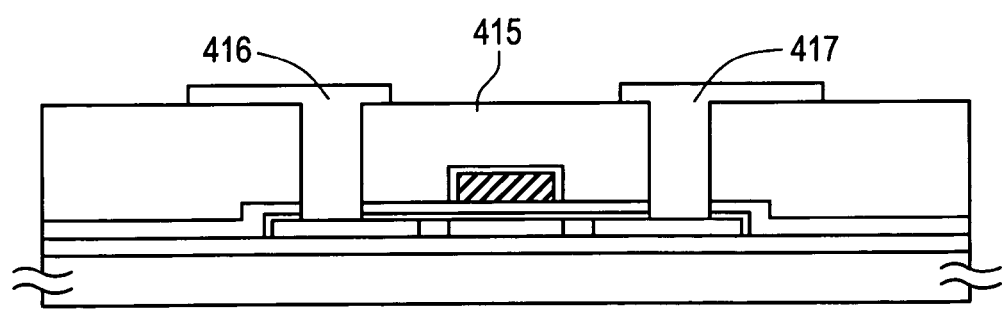

After that, contact holes are created to form a source electrode 416 and a drain electrode 417. Thus, the thin film transistor shown in FIG. 4E is completed.

Seventh Embodiment

The present embodiment relates to a case when an N-channel type thin film transistor and a P-channel type thin film transistor are formed in a complementary manner.

The arrangement shown in the present embodiment may be utilized for various thin film integrated circuits integrated on an insulated surface as well as for peripheral driving circuits of an active matrix type liquid crystal display for example.

Figure 5A:
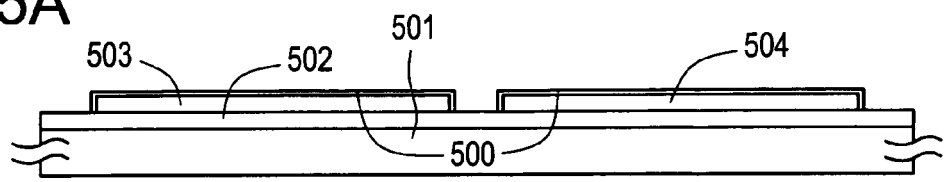
FIG. 5a–f is a diagram showing steps for fabricating a thin film transistor.

At first, a silicon oxide film or a silicon oxide nitride film is formed as an underlying film 502 on a glass substrate 501 as shown in FIG. 5A. It is preferable to use the silicon oxide nitride film.

Next, an amorphous silicon film not shown is formed by the plasma CVD or reduced pressure thermal CVD. Then, the amorphous silicon film is transformed into a crystal silicon film by the same method as shown in the first embodiment.

Next, a plasma treatment is implemented within an atmosphere in which oxygen and hydrogen are mixed. Then, the obtained crystal silicon film is patterned to obtain active layers 503 and 504. Thus, the state shown in FIG. 5A is obtained.

It is noted that a heat treatment of ten hours at 650° C. is implemented within a nitrogen atmosphere containing 3% of HCl in the state shown in FIG. 5A in order to suppress the influence of carriers moving the side of the active layer.

Because an OFF current characteristic is degraded if a trap level exists due to the existence of the metal element on the side of the active layer, it is useful to implement the process shown here to drop the density of the level on the side of the active layer.

Further, the thermal oxide film 500 and the silicon oxide nitride film 505 which compose the gate insulating film are formed. When quartz is used as the substrate here, it is desirable to compose the gate insulating film only by the thermal oxide film formed by using the above-mentioned thermal oxidation.

Next, an aluminum film not shown which composes a gate electrode later is formed in a thickness of 4000 angstrom. Beside the aluminum film, a metal which can be anodized (e.g. tantalum) may be used.

After forming the aluminum film, a very thin and dense anodic oxide film is formed on the surface thereof by the method described before.

Next, a resist mask not shown is placed on the aluminum film to pattern the aluminum film. Then, anodization is implemented by setting the obtained aluminum pattern as the anode to form porous anodic oxide films 508 and 509. The thickness of the porous anodic oxide films is 5000 angstrom for example.

Figure 5B:
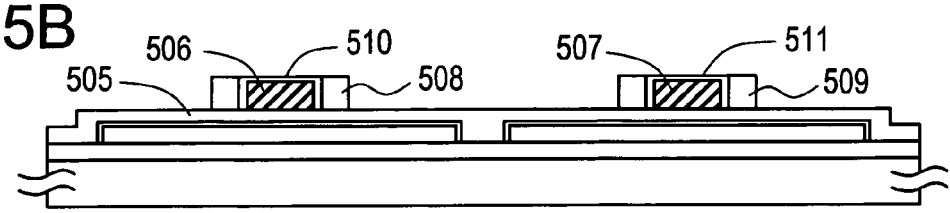

Then, another anodization is implemented under the condition of forming dense anodic oxide films to form dense anodic films 510 and 511. The thickness of the dense anodic oxide films 510 and 511 is 800 angstrom. Thus, the state shown in FIG. 5B is obtained.

Figure 5C:
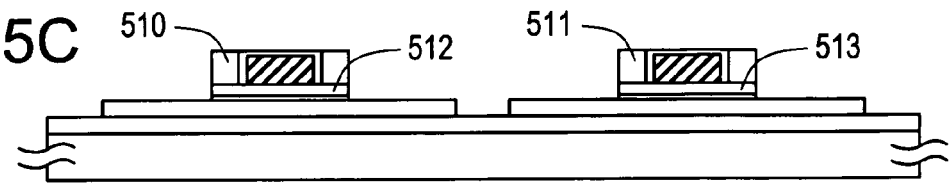

Then, the exposed silicon oxide film 505 and the thermal oxide film 500 are eliminated by dry etching, thus obtaining the state shown in FIG. 5C.

Figure 5D:
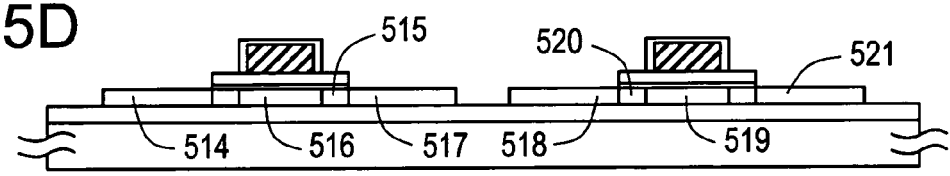

After obtaining the state shown in FIG. 5C, the porous anodic oxide films 508 and 509 are eliminated by using mixed acid in which acetic acid, nitric acid and phosphoric acid are mixed. Thus, the state shown in FIG. 5D is obtained.

Here, resist masks are disposed alternately to inject P ions to the thin film transistor on the left side and B ions to the thin film transistor on the right side.

By injecting those impurity ions, a source domain 514 and a drain domain 517 having N-type in high concentration are formed in a manner of self-adjustment.

Further, a domain 515 to which P ions are doped in low concentration, thus having weak N-type, as well as a channel forming domain 516 are formed in the same time.

The reason why the domain 515 having the weak N-type is formed is because the remaining gate insulating film 512 exists. That is, part of P ions transmitting through the gate insulating film 512 is blocked by the gate insulating film 512.

By the same principle, a source domain 521 and a drain domain 518 having strong P-type are formed in a manner of self-adjustment and a low concentrate impurity domain 520 is formed in the same time. Further, a channel forming domain 519 is formed in the same time.

It is noted that when the thickness of the dense anodic oxide films 510 and 511 is as thick as 2000 angstrom, an offset gate domain may be formed in contact with the channel forming domain by that thickness.

Its existence may be ignored in the case of the present embodiment because the dense anodic oxide films 510 and 511 are so thin as less than 1000 angstrom.

Then, laser light or intense light is irradiated to anneal the domain into which the impurity ions have been injected.

Figure 5E:
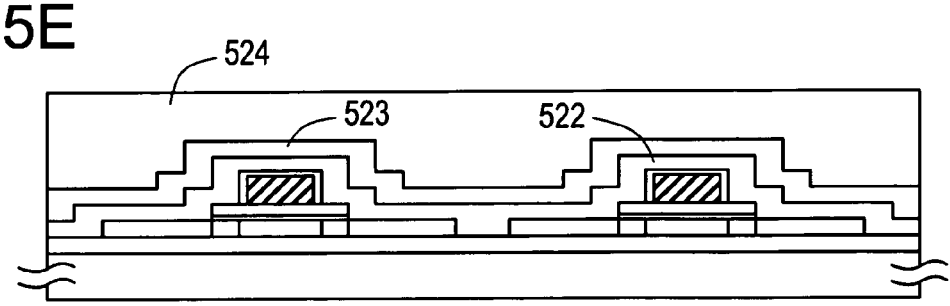
Figure 5F:
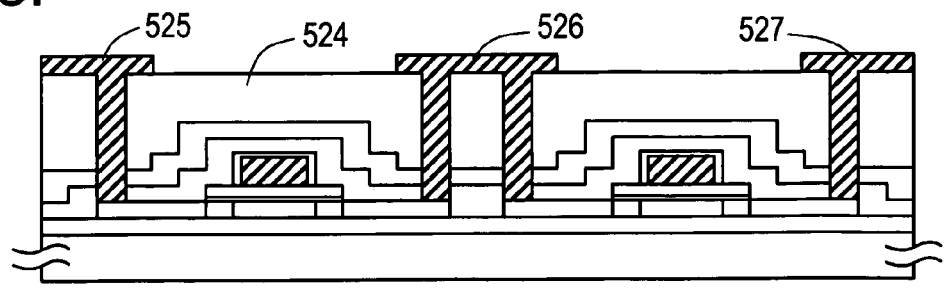

Then, a silicon nitride film 522 and a silicon oxide film 523 are formed as interlayer insulating films as shown in FIG. 5E. Their thickness is 1000 angstrom, respectively. It is noted that the silicon oxide film 523 needs not be formed.

Here, the thin film transistor is covered by the silicon nitride film. The reliability of the thin film transistor may be enhanced by arranging as described above because the silicon nitride film is dense and has a favorite interfacial characteristic.

Further, an interlayer insulating film 524 made of a resin material is formed by means of spin coating. Here, the thickness of the interlayer insulating film 524 is 1 μm (FIG. 5E).

Then, contact holes are created to form a source electrode 525 and a drain electrode 526 of the N-channel type thin film transistor on the left side. In the same time, a source electrode 527 and the drain electrode 526 of the thin film transistor on the right side are formed. Here, the electrode 526 is disposed in common.

Thus, the thin film transistor circuit having a CMOS structure constructed in a complementary manner may be formed.

According to the arrangement shown in the present embodiment, the thin film transistor is covered by the nitride film as well as the resin material. This arrangement allows to enhance the durability of the thin film transistor to which movable ions nor moisture hardly infiltrate.

Further, it allows to prevent capacitance from being generated between the thin film transistor and wires when a multi-layered wire is formed.

Eighth Embodiment

The present embodiment relates to a case when nickel element is introduced directly to the surface of the underlying film in the process shown in the first embodiment. In this case, the nickel element is held in contact with the lower surface of the amorphous silicon film.

In this case, nickel element is introduced after forming the underlying film such that the nickel element (metal element) is held in contact with the surface of the underlying film. Beside the method of using the solution, sputtering, CVD or adsorption may be used as the method for introducing nickel element.

Ninth Embodiment

The present embodiment is characterized in that the crystallinity of an island pattern formed of a crystal silicon film obtained by irradiating laser light in the state shown in FIG. 2E, the state shown in FIG. 3A or the state shown in FIG. 4A is improved.

A predetermined annealing effect can be obtained with relatively low irradiation energy density by irradiating the laser light in the state shown in FIGS. 2E, 3A and 4A.

It is considered to have been effected because the laser energy is irradiated to a spot of small area, thus enhancing the efficiency of energy utilized in the annealing.

Tenth Embodiment

The present embodiment relates to a case in which patterning of an active layer of a thin film transistor is devised in order to enhance the effect of annealing by the irradiation of laser light.

FIG. 6 shows a process for fabricating the thin film transistor according to the present embodiment. At first, a silicon oxide film or silicon oxide nitride film is formed as an underlying layer on a Corning 1737 glass substrate 601.

Next, an amorphous silicon film not shown is formed in a thickness of 500 angstrom by using the reduced pressure thermal CVD. It is noted that this amorphous silicon film turns out to be a crystal silicon film 603 through the crystallization process later.

Next, the amorphous silicon film not shown is crystallized by the method shown in the first embodiment (see FIG. 1) or third embodiment (see FIG. 2) to obtain the crystal silicon film. Thus, the state shown in FIG. 6A is obtained.

Figure 6A:
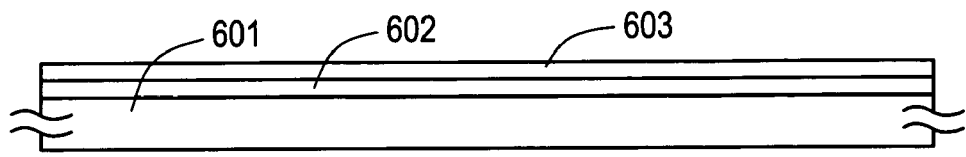
FIG. 6a–f is a diagram showing steps for fabricating an active layer of the thin film transistor.

After obtaining the state shown in FIG. 6A, the crystal silicon film 603 is formed on the glass substrate in accordance to the process shown in the first embodiment whose fabrication process is shown in FIG. 1 or the third embodiment whose fabrication process is shown in FIG. 2. That is, the amorphous silicon film is crystallized by the heat treatment using nickel element to obtain the crystal silicon film 603. The heat treatment is implemented at 620° C. for four hours.

After obtaining the crystal silicon film, a pattern for constructing an active layer of a thin film transistor is formed. At this time, the pattern is formed so as to have a profile 604 shown in FIG. 6B.

Figure 6B:
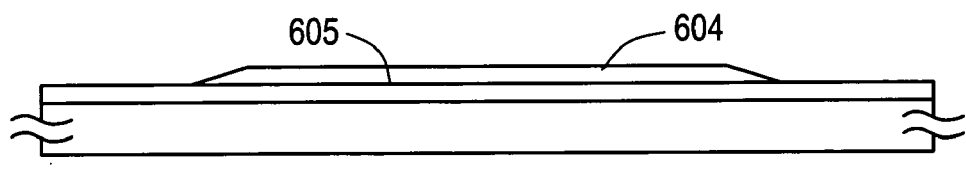

The pattern 604 is formed as shown in FIG. 6B in order to suppress the shape of the pattern from being deformed in the later treatment step of irradiating laser light.

Figure 7A:
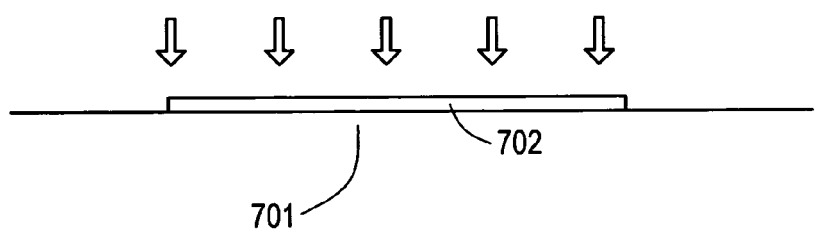
Figure 7B:
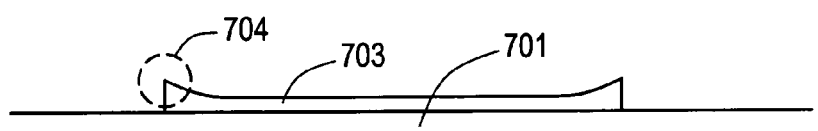

In general, when laser light is irradiated to a pattern 702 made of a normal island-shape silicon film formed on a base 701 as shown in FIG. 7A, a convex portion 704 is formed at the edge of a pattern 703 after the irradiation of the laser light as shown in FIG. 7B.

It is considered to happen because energy of the irradiated laser light is concentrated at the edge of the pattern where heat cannot be released.

The above-mentioned phenomenon may become a factor of defective wires composing a thin film transistor or of defective operation thereof later.

Then, the pattern 604 of the active layer is formed so as to have the profile as shown in FIG. 6B in the arrangement of the present embodiment.

Such arrangement allows to suppress the pattern of the silicon film from being deformed like the one shown in FIG. 7B when laser light is irradiated.

It is preferable to set an angle of the part designated by the reference numeral 605 from 20° to 50°. It is not preferable to set the angle 605 below 20° because an area occupied by the active layer increases and it becomes difficult to form it. Further, it is not also preferable to set the angle 600 above 50° because the effect for suppressing the shape as shown in FIG. 7B from being formed drops.

The pattern 604 may be realized by utilizing isotropic dry etching and by controlling the conditions of this dry etching in patterning it.

Figure 6C:
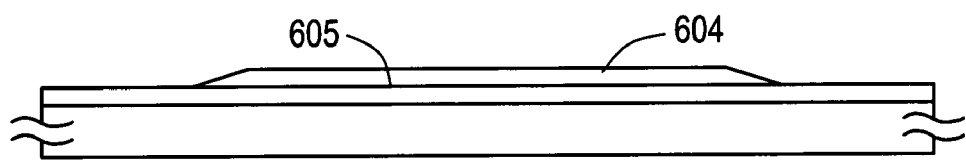

After obtaining the pattern (which turns out to be the active layer later) having the shape 603 in FIG. 6B, laser light is irradiated as shown in FIG. 6C. This step allows to diffuse the nickel element which is locally blocked within the pattern 253 and to promote the crystallization of the pattern.

After finishing to irradiate laser light, a heat treatment is implemented within an oxygen atmosphere to form a thermal oxide film 606. The thermal oxide film is formed in 100 angstrom thick by implementing the heat treatment for 12 hours in the 100% oxygen atmosphere at 650° C. (FIG. 6D).

The nickel element contained in the pattern 604 is gettered to the thermal oxide film by the action of chlorine. At this time, because the block of the nickel element has been destroyed and diffused through the irradiation of laser light in the previous step, the gettering of the nickel element is effectively performed.

Further, the gettering is performed also from the side of the pattern 604 when the arrangement shown in the present embodiment is adopted. This is useful in enhancing the OFF current characteristics and the reliability of the thin film transistor finally completed. It is because the existence of metal element which is typified by nickel element which promotes crystallization of silicon and which exists in the side of the active layer exerts a wide influence over the increase of OFF current and the instability of the characteristics.

Figure 6D:
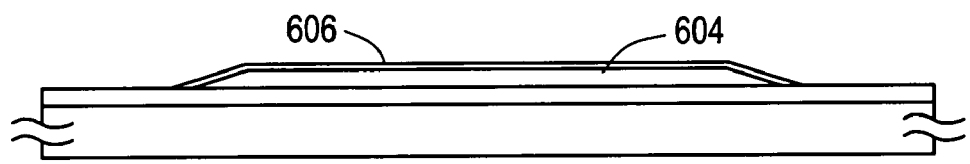
Figure 6E:
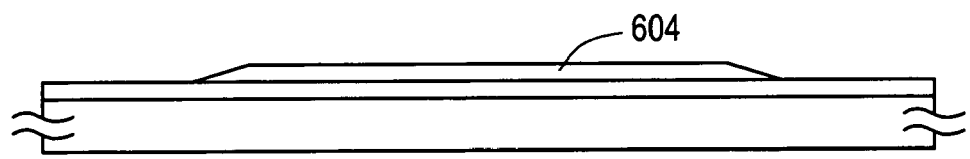
Figure 6F:
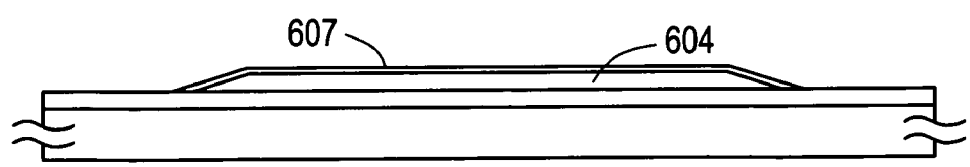

After forming the thermal oxide film 255 for gettering as shown in FIG. 6D, it is eliminated. Thus, the state shown in FIG. 6E is obtained. It is concerned that the silicon oxide film 602 might be etched in the step of eliminating the thermal oxide film 606 when the silicon oxide film is adopted as the underlying layer 602. However, it does not matter so much when the thickness of the thermal oxide film 606 is as thin as 100 angstrom as shown in the present embodiment.

After obtaining the state shown in FIG. 6E, a new thermal oxide film 607 is formed in a thickness of 100 angstrom by a heat treatment in an atmosphere of 100% oxygen.

Here, the thermal oxide film 607 is formed in a thickness of 100 angstrom by the heat treatment for four hours in the oxygen atmosphere at 650° C.

The thermal oxide film 607 is effective in suppressing the surface of the pattern 603 from being roughened when the laser light is irradiated later. The thermal oxide film also forms a part of a gate insulating film later. Because the thermal oxide film has a very favorable interfacial characteristic with the crystal silicon film, it is useful to utilize it as part of the gate insulating film.

The laser light may be irradiated again after forming the thermal oxide film 607. Thus, the crystal silicon film 604 from which the concentration of nickel element has been reduced and which has a high crystallinity may be obtained.

Thereafter, the thin film transistor is fabricated by going through the process shown in FIG. 3 or 4.

Eleventh Embodiment

The present embodiment relates to a case devised in applying a heat treatment at a temperature more than a distortion point of a glass substrate. It is preferable to perform the process for gettering the metal element which promotes crystallization of silicon in the present invention disclosed in the present specification at a high temperature as much as possible.

When the Corning 1737 glass substrate (distortion point: 667° C.) is used for instance, the higher gettering effect can be obtained when the temperature in gettering nickel element by forming the thermal oxide film is 700° C. rather than when it is 650° C.

However, if the heating temperature for forming the thermal oxide film is set at 700° C. while using the Corning 1737 glass substrate, the glass substrate deforms as a result.

The present embodiment provides means for solving this problem. That is, according to the arrangement shown in the present embodiment, the glass substrate is placed on a lapping plate which is formed of quartz whose flatness is guaranteed and the heat treatment is implemented in this state.

Thereby, the flatness of the softened glass substrate is maintained by the flatness of the lapping plate. It is noted that it is also important to implement cooling also in the state in which the glass substrate is placed on the lapping plate.

The adoption of such arrangement allows the heat treatment to be implemented even if it is in the temperature more than the distortion point of the glass substrate.

The use of the invention disclosed in the present specification allows to provide the technology for reducing the concentration of metal element within the crystal silicon film which has been obtained by utilizing the metal element which promotes the crystallization of silicon.

The use of this technology also allows a more reliable and higher performance thin film semiconductor device to be obtained.

What is claimed is:

1. A method for fabricating a semiconductor device, comprising:
    forming an insulating base film comprising silicon oxynitride oxide nitride over a substrate;
    forming an amorphous semiconductor film comprising silicon over the insulating base film;
    introducing a metal element which promotes crystallization of silicon to the amorphous semiconductor film comprising silicon;
    crystallizing said amorphous semiconductor film by a first heat treatment to obtain a crystalline semiconductor film comprising silicon;
    irradiating said crystalline semiconductor film with a light selected from laser light and intense light in order to diffuse said introduced metal element throughout said crystalline semiconductor film;
    gettering said metal element from said crystalline semiconductor film by implementing a second heat treatment within an oxidizing atmosphere after said irradiating, thereby a first thermal oxide film of said semiconductor film including said metal element is formed on said crystalline semiconductor film;
    removing said first thermal oxide film to expose a surface of said crystalline semiconductor film;
    patterning said crystalline semiconductor film after removing the first thermal oxide film; and
    forming a second thermal oxide film of said semiconductor film on the exposed surface of said crystalline semiconductor film by implementing a third heat treatment after said patterning,
    wherein a temperature of the first heat treatment is within a range of 550 to 650° C. and a temperature of the second heat treatment is within a range of 600 to 750° C.

2. A method for fabricating a semiconductor device, comprising:
    forming an insulating base film comprising silicon oxide nitride over a substrate;
    forming an amorphous semiconductor film comprising silicon over the insulating base film;
    introducing a metal element which promotes crystallization of silicon to the amorphous semiconductor film comprising silicon;
    crystallizing said amorphous semiconductor film by a first heat treatment to obtain a crystalline semiconductor film comprising silicon;
    irradiating said crystalline semiconductor film with a light selected from laser light and intense light to diffuse said introduced metal element within said crystalline semiconductor film;
    forming a first thermal oxide film of said semiconductor film by implementing a second heat treatment within an oxidizing atmosphere after said irradiating, thereby said metal element within said crystalline semiconductor film is gettered into said first thermal oxide film;
    removing said first thermal oxide film to expose a surface of the crystalline semiconductor film;
    patterning said crystalline semiconductor film after said removing to form an active layer of said semiconductor device; and
    forming a second thermal oxide film of said semiconductor film on the active layer by implementing a third heat treatment after said patterning,
    wherein a temperature of the first heat treatment is within a range of 550 to 650° C. and a temperature of the second heat treatment is within a range of 600 to 750° C.

3. A method for fabricating a semiconductor device, comprising:
    forming an insulating base film comprising silicon oxide nitride over a substrate;
    forming an amorphous semiconductor film comprising silicon over the insulating base film;
    selectively introducing a metal element which promotes crystallization of silicon to the amorphous semiconductor film comprising silicon;
    implementing a first heat treatment to said amorphous semiconductor film to grow crystal in the direction parallel to the film from a portion into which said metal element has been selectively introduced;
    irradiating the semiconductor film with a light selected from laser light and intense light to diffuse said metal element existing in a domain in which said crystal has grown;
    implementing a second heat treatment within an oxidizing atmosphere after said irradiating in order to form a first thermal oxide film of said semiconductor film thereon, thereby said metal element is gettered into said first thermal oxide film;
    removing said first thermal oxide film formed by the second heat treatment to expose a surface of the semiconductor film;
    patterning said crystalline semiconductor film after removing the first thermal oxide film;
    forming a second thermal oxide film of said semiconductor film on the exposed surface of the semiconductor film by implementing a third heat treatment after said patterning; and
    forming an insulating film comprising silicon on said second thermal oxide film by CVD method, wherein a temperature of the first heat treatment is within a range of 550 to 650° C. and a temperature of the second heat treatment is within a range of 600 to 750° C.

4. The method according to any one of claims 1 through 2, wherein a gate insulating film is formed by utilizing said second thermal oxide film.

5. The method according to any one of claims 1 through 3, wherein one or a plurality elements selected from Fe, Co, Ni, Ru, Rh, Pd, Os, Ir, Pt, Cu and Au is used as the metal element which promotes crystallization of silicon.

6. The method according to any one of claims 1 through 3, wherein said semiconductor device is an EL display device.

7. The method according to any one of claims 1 through 3, further comprising a step of annealing is carried out in a plasma atmosphere containing oxygen and hydrogen after removing said first thermal oxide film.

8. The method according to any one of claims 1 through 3, wherein a concentration of oxygen contained in said amorphous semiconductor film is $5\times10^{17}$ cm$^{-3}$ to $2\times10^{19}$ cm$^{-3}$.

9. A method for fabricating a semiconductor device, comprising:
   forming an insulating base film comprising silicon oxide nitride over a substrate;
   forming an amorphous semiconductor film comprising silicon over the insulating base film;
   introducing a metal element which promotes crystallization of silicon to the amorphous semiconductor film comprising silicon;
   crystallizing said amorphous semiconductor film by a first heat treatment to obtain a crystalline semiconductor film comprising silicon;
   patterning said crystalline semiconductor film to form an active layer of said semiconductor device;
   irradiating said active layer with a light selected from laser light and intense light in order to diffuse said introduced metal element throughout said active layer;
   forming a first thermal oxide film of said semiconductor film by implementing a second heat treatment within an oxidizing atmosphere after said irradiating, thereby said metal element in said active layer is gettered into said first thermal oxide film;
   removing said first thermal oxide film to expose a surface of said active layer;
   forming a second thermal oxide film of said semiconductor film on the exposed surface of said active layer by implementing a third heat treatment after removing said first thermal oxide film; and
   forming an insulating film comprising silicon on said second thermal oxide film by CVD method,
   wherein a temperature of the first heat treatment is within a range of 550 to 650° C. and a temperature of the second heat treatment is within a range of 600 to 750° C.

10. A method for fabricating a semiconductor device, comprising:
   forming an insulating base film comprising silicon oxide nitride over a substrate;
   forming an amorphous semiconductor film comprising silicon on the insulating base film;
   introducing a metal element which promotes crystallization of silicon to said amorphous semiconductor film;
   crystallizing said amorphous semiconductor film by a first heat treatment to obtain a crystalline semiconductor film comprising silicon;
   patterning said crystalline semiconductor film to form an active layer of said semiconductor device;
   irradiating said active layer with a light selected from laser light and intense light in order to diffuse said introduced metal element throughout said active layer;
   forming a first thermal oxide film of said semiconductor film by implementing a second heat treatment within an oxidizing atmosphere, thereby said metal element existing within said active layer is gettered into said first thermal oxide film;
   removing said first thermal oxide film; and
   forming a second thermal oxide film of said semiconductor film on a surface of said active layer by implementing a third heat treatment after removing said first thermal oxide film, wherein said active layer has an inclined shape having an angle of 20° to 50°, which is made between a side thereof and said insulating surface, and
   wherein a temperature of the first heat treatment is within a range of 550 to 650° C. and a temperature of the second heat treatment is within a range of 600 to 750° C.

11. The method according to claim 10, wherein a gate insulating film is formed by utilizing said second thermal oxide film.

12. The method according to claim 9 or 10, wherein one or a plurality elements selected from Fe, Co, Ni, Ru, Rh, Pd, Os, Ir, Pt, Cu and Au is used as the metal element which promotes crystallization of silicon.

13. The method according to claim 9 or 10, wherein said semiconductor device is an EL display device.

14. The method according to claim 9 or 10, further comprising a step of annealing is carried out in a plasma atmosphere containing oxygen and hydrogen after removing said first thermal oxide film.

15. The method according to claim 9 or 10, wherein a concentration of oxygen contained in said amorphous semiconductor film is $5\times10^{17}$ cm$^{-3}$ to $2\times10^{19}$ cm$^{-3}$.

16. The method according to claim 3 wherein a gate insulating film of the semiconductor device consists of the second thermal oxide film and the insulating film comprising silicon.

17. The method according to claim 1 or 2, further comprising the step of forming an insulating film comprising silicon on said second thermal oxide film.

18. The method according to any one of claims 1 through 3, wherein after said removing the first thermal oxide film, a concentration of said metal element in the semiconductor film is $10^{17}$ cm$^{-3}$ or less.

19. The method according to claim 9 wherein a gate insulating film of the semiconductor device consists of the second thermal oxide film and the insulating film comprising silicon thereon.

20. The method according to claim 9 or 10, wherein after said removing the first thermal oxide film, a concentration of said metal element in the semiconductor film is $10^{17}$ cm$^{-3}$ or less.

21. A method for fabricating a semiconductor device, comprising:
   forming an insulating base film comprising silicon oxide nitride over a substrate;
   forming an amorphous semiconductor film comprising silicon over the insulating base film;
   introducing an element which promotes crystallization of said semiconductor film to said amorphous semiconductor film;
   implementing a first heat treatment in order to crystallize said amorphous semiconductor film;
   patterning said crystallized semiconductor film to form an active layer of said semiconductor device;
   diffusing said introduced element throughout said active layer by irradiating the active layer with a light selected from laser light and intense light; and
   implementing a second heat treatment in order to remove said element in said active layer after said diffusing, thereby a first thermal oxide film of said active layer is formed thereon,
   wherein a temperature of the second heat treatment is higher than that of the first heat treatment.

22. A method according to claim 21, wherein said second heat treatment is implemented in a temperature above 600° C. and below 750° C.

23. A method according to claim 21, wherein said element which promotes crystallization is selected from the group consisting of Fe, Co, Ni, Ru, Rh, Pd, Os, Ir, Pt, Cu and Au.

24. A method according to claim 21, wherein said semiconductor device is an EL display device.

25. A method according to claim 21, further comprising a step of annealing is carried out in a plasma atmosphere containing oxygen and hydrogen after said second heat treatment.

26. A method according to claim 21, further comprising steps of:
- forming a second thermal oxide film of said active layer thereon by implementing a third heat treatment after removing said first thermal oxide film; and
- forming an insulating film comprising silicon on said second thermal oxide film by CVD method.

27. A method according to claim 21, wherein said active layer has an inclined shape having an angle of 20° to 50°, which is made between a side thereof and said insulating surface.

28. A method according to claim 21, wherein after removing the first thermal oxide film, a concentration of said element in the active layer is $10^{17}$ cm$^{-3}$ or less.

29. A method for fabricating a semiconductor device, comprising:
- forming an insulating base film comprising silicon oxide nitride over a substrate;
- forming an amorphous semiconductor film comprising silicon over the insulating base film;
- introducing an element which promotes crystallization of said semiconductor film to said amorphous semiconductor film;
- crystallizing said amorphous semiconductor film by a first heat treatment;
- patterning said crystalline semiconductor film to form an active layer of said semiconductor device;
- diffusing said introduced element throughout said active layer by irradiating said active layer with a light selected from laser light and intense light; and
- removing said element in said active layer by implementing a second heat treatment after said diffusing, thereby a first thermal oxide film of said active layer is formed thereon,
- wherein a temperature of the second heat treatment is higher than that of the first heat treatment.

30. A method according to claim 29, wherein said second heat treatment is implemented in a temperature above 600° C. and below 750° C.

31. A method according to claim 29, wherein said element which promotes crystallization is selected from the group consisting of Fe, Co, Ni, Ru, Rh, Pd, Os, Ir, Pt, Cu and Au.

32. A method according to claim 29, wherein said semiconductor device is an EL display device.

33. A method according to claim 29, further comprising a step of annealing is carried out in a plasma atmosphere containing oxygen and hydrogen after removing said first thermal oxide film.

34. A method according to claim 29, further comprising steps of:
- forming a second thermal oxide film of said active layer thereon by implementing a third heat treatment after removing said first thermal oxide film; and
- forming an insulating film comprising silicon on said thermal oxide film by CVD method.

35. A method according to claim 29, wherein said active layer has an inclined shape having an angle of 20° to 50°, which is made between a side thereof and said insulating surface.

36. A method according to claim 29, wherein after said removing the first thermal oxide film, a concentration of said element in the active layer is $10^{17}$ cm$^{-3}$ or less.

* * * * *